United States Patent [19]
Komatsu

[11] Patent Number: 6,028,490
[45] Date of Patent: Feb. 22, 2000

[54] RING OSCILLATORS HAVING INVERTING AND DELAY ELEMENTS

[75] Inventor: Yoshihiro Komatsu, Kanagawa, Japan

[73] Assignee: Sony Corporation, Japan

[21] Appl. No.: 09/064,754

[22] Filed: Apr. 23, 1998

[30]  Foreign Application Priority Data

Apr. 25, 1997 [JP] Japan ................................ P09-109345
Sep. 11, 1997 [JP] Japan ................................ P09-247104

[51] Int. Cl.$^7$ ................................................... H03B 5/24
[52] U.S. Cl. ............................................. 331/57; 331/135
[58] Field of Search ....................................... 331/57, 135

[56]  References Cited

U.S. PATENT DOCUMENTS 4,656,369  4/1987  Lou ............................................. 331/57

Primary Examiner—Siegfried H. Grimm
Attorney, Agent, or Firm—Rader, Fishman & Grauer; Ronald P. Kananen

[57]  ABSTRACT

An oscillator circuit constituted by connecting in a ring an odd number of stages of inverting delay circuits comprising inverting elements, for example, inverters INV1, INV2, and INV3, and delay elements D1, D2, and D3 connected to the output terminals of the inverting elements. In each delay element, the capacitor is charged and discharged in accordance with the output signal level from the inverter, the voltage of the capacitor and the reference voltage are compared by a comparison circuit, and a signal in accordance with the result of comparison is input to the inverting delay circuit of the next stage, therefore the delay time can be controlled by controlling the charging current of the delay element and the oscillation frequency can be controlled in accordance with this. Accordingly, the control property thereof is good, the range of variation can be broadened, and a reduction of jitter can be realized.

15 Claims, 34 Drawing Sheets

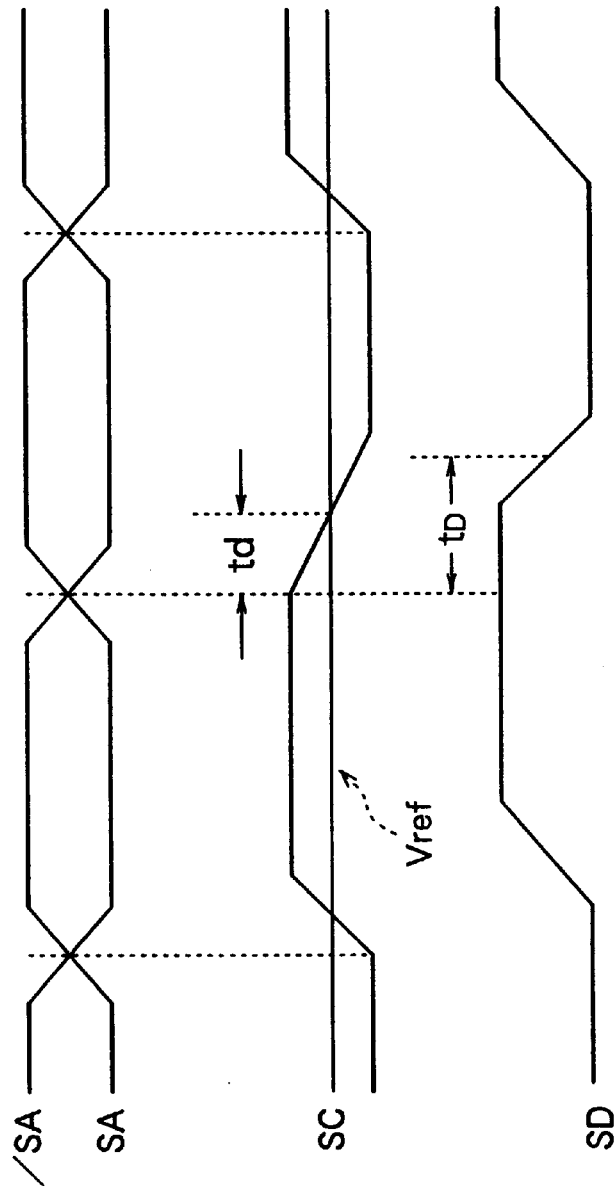

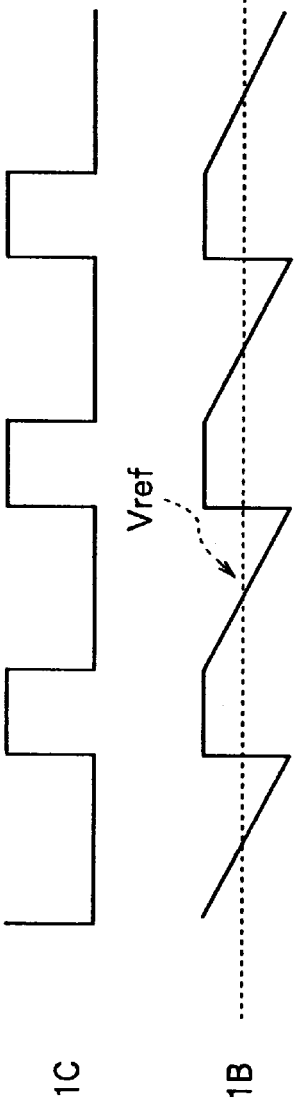
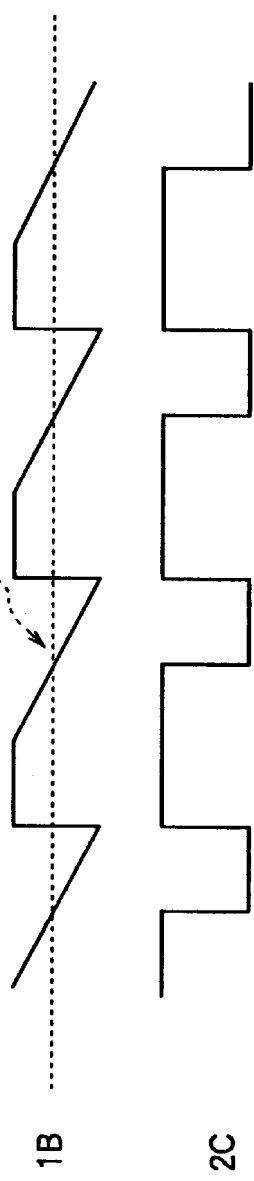
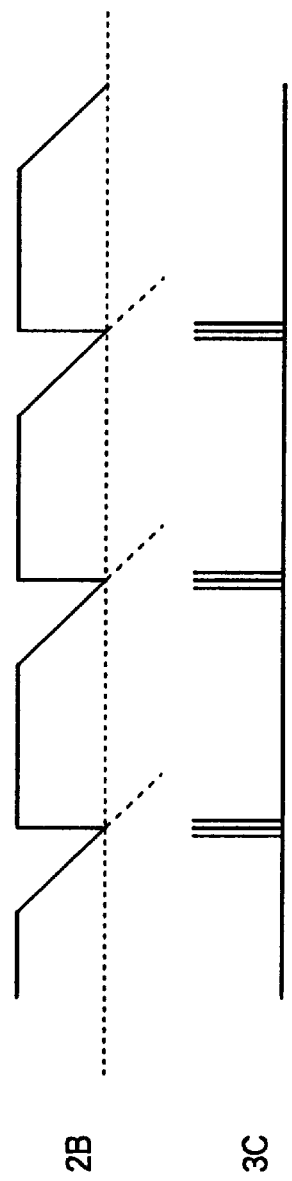
FIG. 12A
FIG. 12B
FIG. 12C
FIG. 12D
FIG. 12E
FIG. 12F

1A

1B

Vref

2A

2B

3A

3B

4A

4B

FIG. 18A
FIG. 18B
FIG. 18C
FIG. 18D
FIG. 18E
FIG. 18F
FIG. 18G
FIG. 18H
FIG. 18I
FIG. 18J
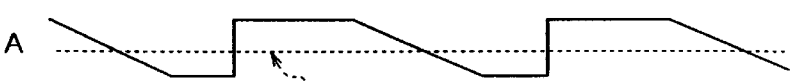
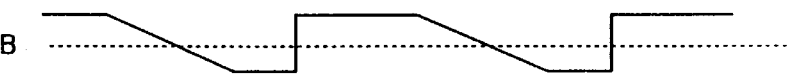
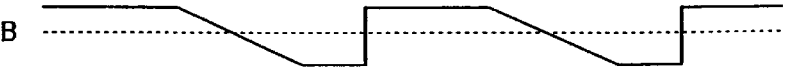

FIG. 20A
FIG. 20B
FIG. 20C
FIG. 20D
FIG. 20E
FIG. 20F
FIG. 20G
FIG. 20H
FIG. 20I
FIG. 20J
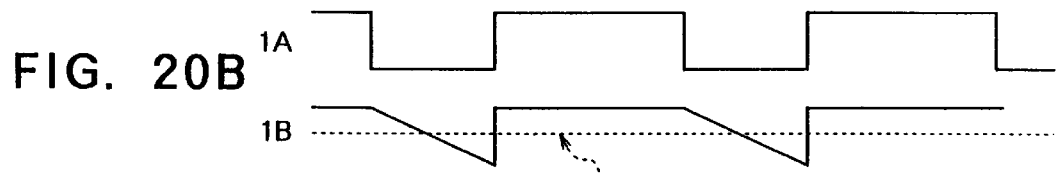
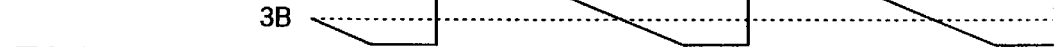
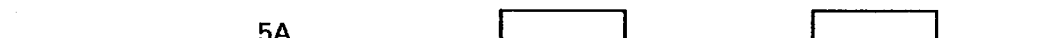

Vref

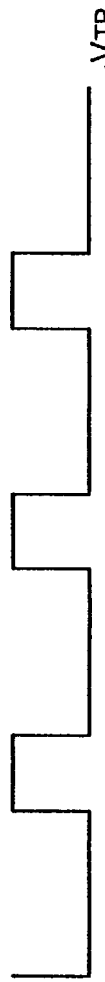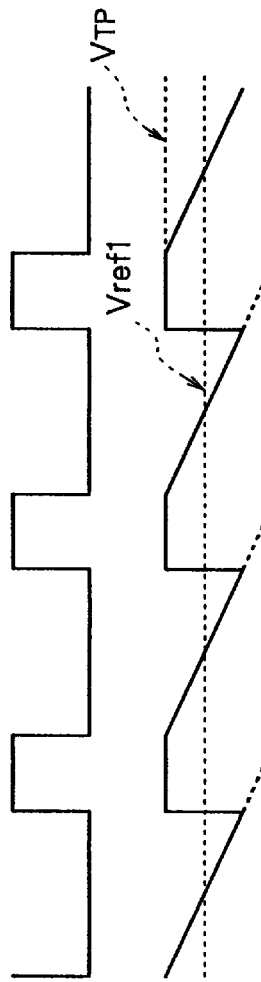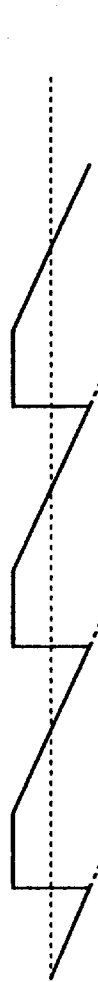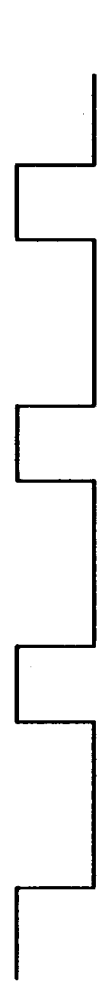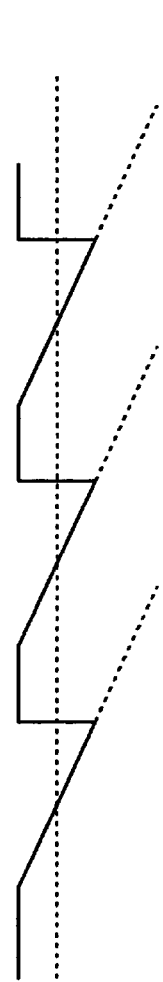
FIG. 29A  1A
FIG. 29B  1B
FIG. 29C  2A
FIG. 29D  2B
FIG. 29E  3A
FIG. 29F  3B

RING OSCILLATORS HAVING INVERTING AND DELAY ELEMENTS

BACKGROUND OF THE INVENTION

1. Field of the Invention

The present invention relates to an oscillator circuit constituted of a plurality of inverting and non-inverting delay circuits connected in the form of a ring.

2. Description of the Related Art

An oscillator circuit may be configured by connecting an odd number of inverting delay circuits, for example, the three inverting delay circuits DLY1, DLY2, and DLY3, in the form of the ring. FIG. 1 is a circuit diagram of a ring oscillator circuit constituted in this way, while FIG. 2 shows the configuration of an inverting delay circuit comprising inverting elements and delay elements connected to the output side of the inverting elements.

As shown in FIG. 2, an inverting element is constituted by a differential amplifier circuit. The delay element connected to the output side thereof is constituted by a transistor and capacitor forming an emitter follower. The differential amplifier circuit is constituted by transistors Q1 and Q2, resistance elements R1 and R2, and a current source I1, while the delay element is constituted by transistors Q3 and Q4, capacitors C1 and C2, and transistors Q5 and Q6.

In the differential amplifier circuit, bases of the transistors Q1 and Q2 are respectively connected to input terminals Tin and T/in, collectors are connected to a supply line of a power supply voltage $V_{CC}$ via the resistance elements R1 and R2, respectively, and emitters are commonly connected to the current source I1. The connection nodes formed by the collectors of the transistors Q1 and Q2 and the resistance elements R1 and R2 constitute the output nodes of the differential amplifier circuit. A current $i_1$ is supplied by the current source I1.

In the delay element, transistors Q3 and Q4 form an emitter follower. Bases of the transistors Q3 and Q4 are respectively connected to the output nodes ND1 and ND2 of the differential amplifier circuit, while the emitters are respectively connected to the output nodes ND3 and ND4 of the delay element. The capacitor C1 is connected between the node ND3 and the supply line of the power supply voltage $V_{CC}$, and the capacitor C2 is connected between the node ND4 and the supply line of the power supply voltage $V_{CC}$. Both of bases of the transistors Q5 and Q6 are connected to an input terminal Tc of a control signal Sc, the collectors are respectively connected to the nodes ND3 and ND4, and the emitters are grounded via the resistance elements R3 and R4, respectively.

Input signals SA and /SA are respectively supplied to the input terminals Tin and T/in, an inverted signal /SB of the input signal SA is supplied to the output node ND1 of the differential amplifier circuit, and an inverted signal SB of the input signal /SA is output to the output node ND2.

Output signals of the nodes ND1 and ND2 are output to the nodes ND3 and ND4 by the emitter follower comprising the transistors Q3 and Q4, respectively. Potentials of the nodes ND3 and ND4 are set by the charging and discharging of the capacitors C1 and C2 in accordance with the input signal, the voltage of the node ND3 is output as an output signal /SC to an output terminal T/out, and the voltage of the node ND4 is output as an output signal SC to an output terminal Tout.

The transistors Q5 and Q6 constitute a current source for controlling charging currents $i_2$ and $i_3$ of the capacitors C1 and C2. Collector currents of the transistors Q5 and Q6 are determined by the control signal Sc input to the input terminal Tc. These collector currents become charging currents of the capacitors C1 and C2. Here, for example, if both of the voltages between bases and emitters when the transistors Q3 and Q4 are in an on state are Vf, voltages of the nodes ND3 and ND4 become ($V_{CC}$-Vf) when the transistor Q3 or Q4 is on. When the transistor Q3 or Q4 switches from the on state to an off state, the capacitors C1 and C2 are charged by the currents $i_2$ and $i_3$, respectively, and voltages of the nodes ND3 and ND4 rise along with the charging of the capacitors C1 and C2. Here, if both of resistance values of the resistance elements R1 and R2 are R, an amplitude of the signal of collectors of the transistors Q1 and Q2 becomes ($R \cdot i_1$). When the charging to the capacitor C1 or C2 is ended, the voltage of the node ND3 or ND4 is held at ($V_{CC}$-Vf-$R \cdot i_1$).

FIGS. 3A to 3C are waveform diagrams of parts of the delay circuit shown in FIG. 2. As illustrated, the levels of the output signals SB and /SB of the inverting element comprising the differential amplifier circuit change in accordance with the change of level of the input signals SA and /SA. The signals SB and /SB are input to the delay element, and the levels of the output signals SC and /SC of the delay circuit change in accordance with these signals. For example, when the input signal SA is at a high level, the output signal SB of the differential amplifier circuit is also held at the high level, for example, the power supply voltage $V_{CC}$ or a level near this, while conversely when the input signal SA is at a low level, the output signal SB of the differential amplifier circuit is also held at a low level, that is, the ($V_{CC}$-$R \cdot i_1$) level. When the signal SB becomes a low level, the transistor Q4 turns off, and the capacitor C2 is charged, therefore the voltage of the node ND4 falls. When the signal SB switches from a low level to a high level, the transistor Q4 switches from the off state to the on state, and the capacitor C2 discharges via the transistor Q4, therefore the voltage of the node ND4 rises along with the discharge and is held at a high level, for example, the ($V_{CC}$-Vf) level.

The discharging of the capacitor C2 is carried out via the transistor Q4 in the on state. The on resistance of the transistor Q4 is low and the discharge of the capacitor is fast. On the other hand, the charging of the capacitor C2 is carried out via the transistor Q6. If the charging current $i_3$ is small, the charging time becomes longer than the discharging time. As a result, the waveform of the output signal SC of the delay element becomes asymmetrical between the rising and trailing edges as shown in FIGS. 3A to 3C. That is, the rising edge is sharp, and the trailing edge is gentle.

Similarly, the signal /SC output from the delay element has the same characteristics. By adjusting the level of the control signal Sc supplied to the bases of the transistors Q5 and Q6, the charging time of the capacitors C1 and C2 is controlled, that is, the slew rate of the fall of the signals SC and /SC is controlled, and a delay time td of the delay element is controlled.

A clock signal CLK of a cycle (2n×td) is obtained by the oscillator circuit by using an odd number n of stages of delay circuits comprising such inverting elements and delay elements and connecting them in the form of a ring.

In the oscillator circuit of the related art, the slew rate of the rising edge of the output signal of the delay circuit is not controlled by the control signal Sc and is substantially fixed. The delay time of the delay circuit is controlled in accordance with only the slew rate of the trailing edge, therefore a large delay time cannot be formed while enhancing the control property of the delay time. As a result, in the oscillator circuit of the related art, there were the disadvantages that the control property was poor and the range of variation of the frequency could not be increased.

SUMMARY OF THE INVENTION

The present invention was made in consideration with such a circumstance and has as an object thereof to provide an oscillator circuit giving a good control property of the oscillation frequency and a wide range of variation of frequency and enabling a reduction of jitter of the oscillation frequency.

To achieve the above object, according to a first aspect of the present invention, there is provided an oscillator circuit having a plurality of inverting delay circuits comprising inverting elements and delay elements connected to the output side of the inverting elements, an odd number of at least three of the inverting delay circuits being connected in the form of a ring.

In this aspect of the present invention, preferably an inverting element is constituted by a differential amplifier circuit; a delay element has a capacitor charging and discharging in accordance with an input signal and a current source for supplying a charging current to the capacitor; and provision is made of a comparison circuit for comparing the output signal of the delay element with a predetermined reference voltage and outputting a signal of a level in accordance with the result of comparison.

According to a second aspect of the present invention, there is provided an oscillator circuit comprising, connected in a ring, an odd number of inverting delay circuits each comprising an inverting element and a delay element connected to the output side of the inverting element and at least one non-inverting delay circuit comprising a buffer and a delay element connected to the output side of the buffer.

According to a third aspect of the present invention, there is provided an oscillator circuit constituted by connecting an odd number of stages of inverting delay circuits in the form of a ring, wherein the inverting delay circuit has a comparing means for comparing an input signal with a predetermined reference signal and a capacitance element controlled in charging and discharging state in accordance with the result of comparison of the comparing means.

In the oscillator circuit of this aspect of the present invention, preferably the comparing means is constituted by a differential amplifier circuit with one input terminal receiving as input the input signal and with the other input terminal receiving as input the reference signal.

Further, in the oscillator circuit of this aspect of the present invention, preferably a power supply line for supplying a power supply voltage and a common voltage line for supplying a common voltage are respectively independently provided in the inverting delay circuit of above each stage.

According to the present invention, the inverting delay circuit is constituted by inverting elements and delay elements connected to the output side thereof, and further the non-inverting delay circuit is constituted by a buffer and the delay elements connected to the output side thereof. In an oscillator circuit constituted by connecting an odd number of inverting elements and any number of non-inverting delay circuits in the form of a ring, the delay time of the delay element can be controlled by controlling the charging current in the delay element of each delay circuit, therefore the control property and range of variation of the oscillation frequency of the oscillator circuit can be broadened.

Further, by setting the number of stages of the inverting delay circuit constituting the oscillator circuit to at least three, the jitter of the oscillation frequency can be suppressed and stability of oscillation operation can be achieved.

Further, according to the present invention, by providing a power supply voltage line and a common voltage line for supplying the power supply voltage and common voltage, for example, a ground voltage, in each of the inverting delay circuits connected in the form of a ring, noise generated due to a mutual interference among the inverting delay circuits can be reduced and the jitter produced by this can be suppressed, therefore an oscillator circuit with little jitter can be constructed and stable oscillation signals can be obtained.

BRIEF DESCRIPTION OF THE DRAWINGS

These and other objects and features of the present invention will become clearer from the following description of the preferred embodiments given with reference to the accompanying drawings, in which:

FIGS. 7A to 7C are signal waveform diagrams of the operation of the oscillator circuit of FIG. 6;

FIGS. 12A to 12F are waveform diagrams of the operation of the oscillator circuit of FIG. 11;

FIGS. 18A to 18J are waveform diagrams of the operation of the oscillator circuit of FIG. 17;

FIGS. 20A to 20J are waveform diagrams of the operation of the oscillator circuit of FIG. 19;

FIGS. 29A to 29F are waveform diagrams of the operation of an oscillator circuit when the reference voltage is set to ¾ of the maximum level;

DESCRIPTION OF THE INVENTION

The present invention forms a ring oscillator circuit by using two types of basic circuits, that is, an inverting delay circuit comprising inverting elements and delay elements and a non-inverting delay circuit comprising non-inverting elements and delay elements. It improves the control property of the oscillator circuit, broadens the range of variation of the oscillation frequency, and further reduces the jitter of the oscillation signal. Below, a detailed explanation will be given of the present invention by referring to FIG. 4 to FIG. 38 to clarify the characteristic features of the present invention.

First Embodiment

Figure 1:
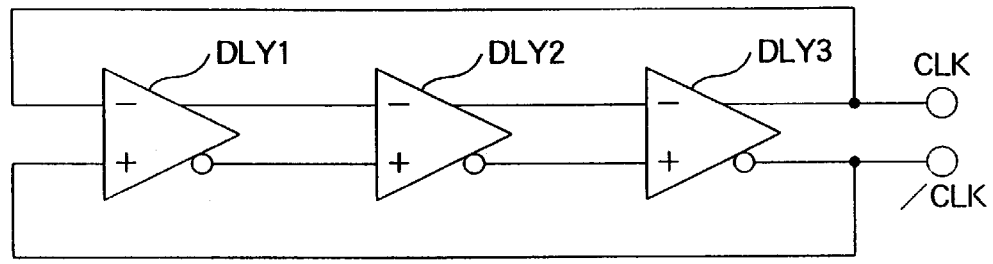
FIG. 1 is a circuit diagram of a ring oscillator circuit of the related art.
Figure 2:
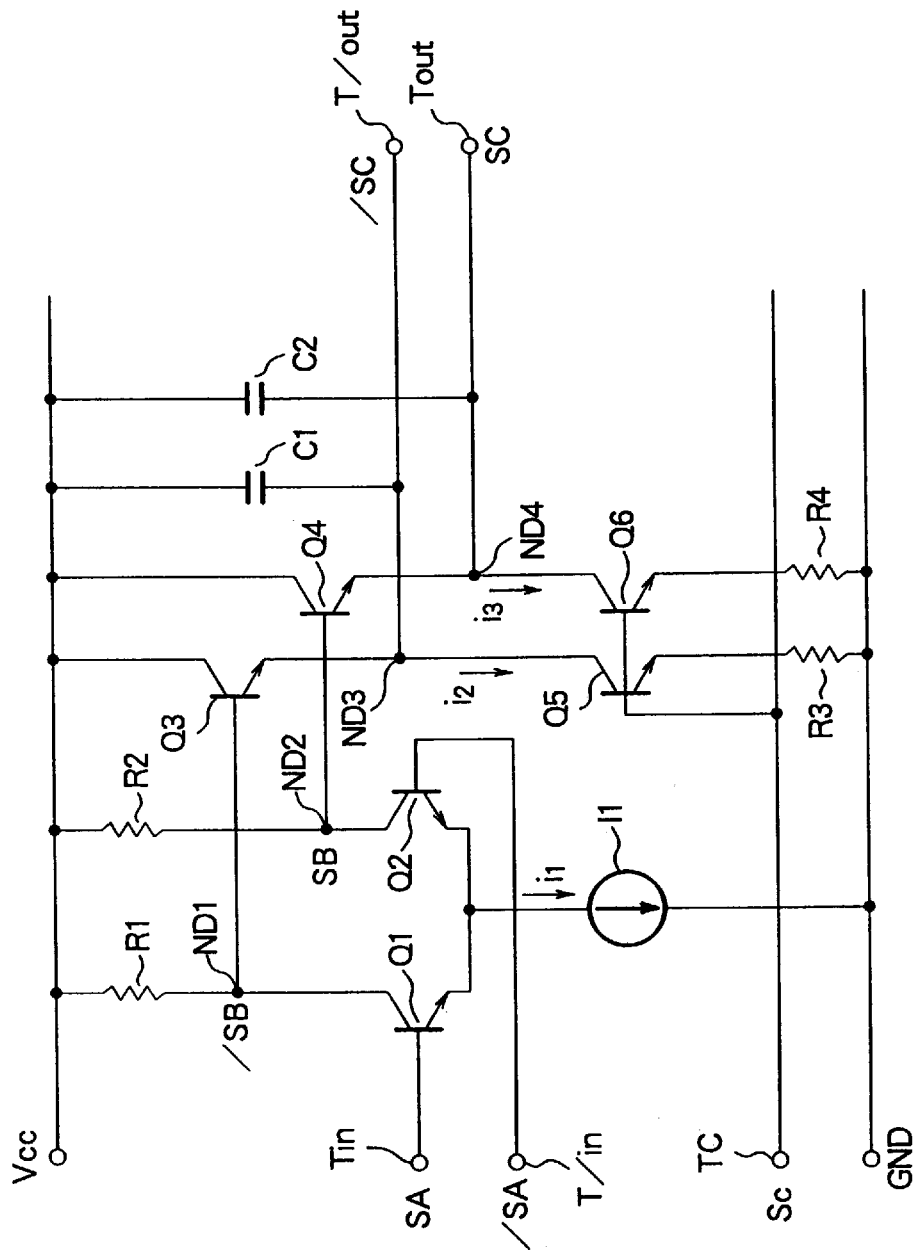
FIG. 2 is a circuit diagram of inverting elements constituting the oscillator circuit of the related art.
Figure 3:
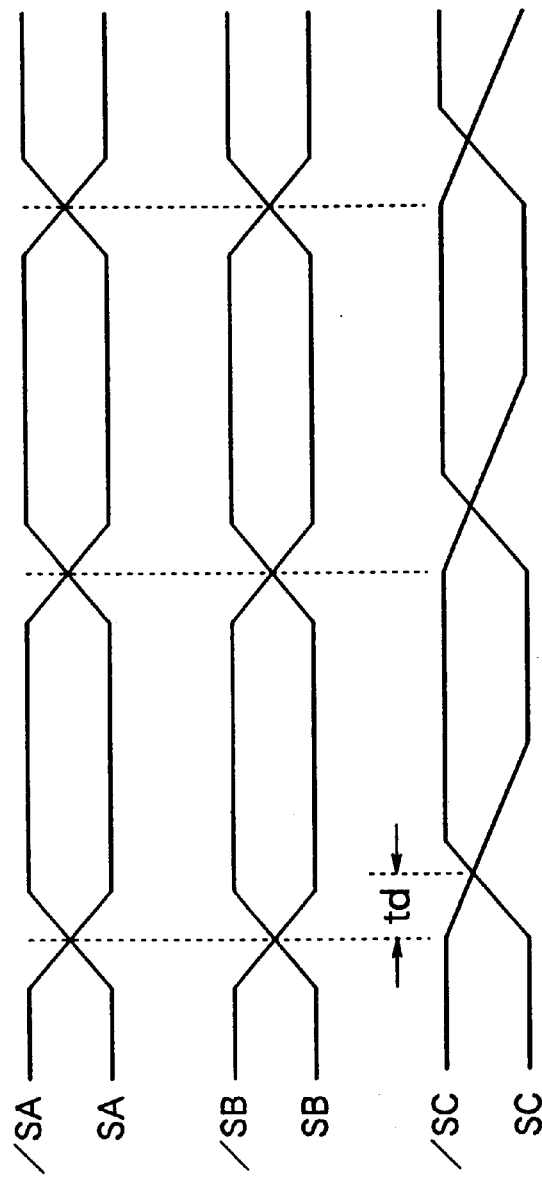
FIGS. 3A to 3C are waveform diagrams of an operation of the oscillator circuit of the related art.
Figure 4:
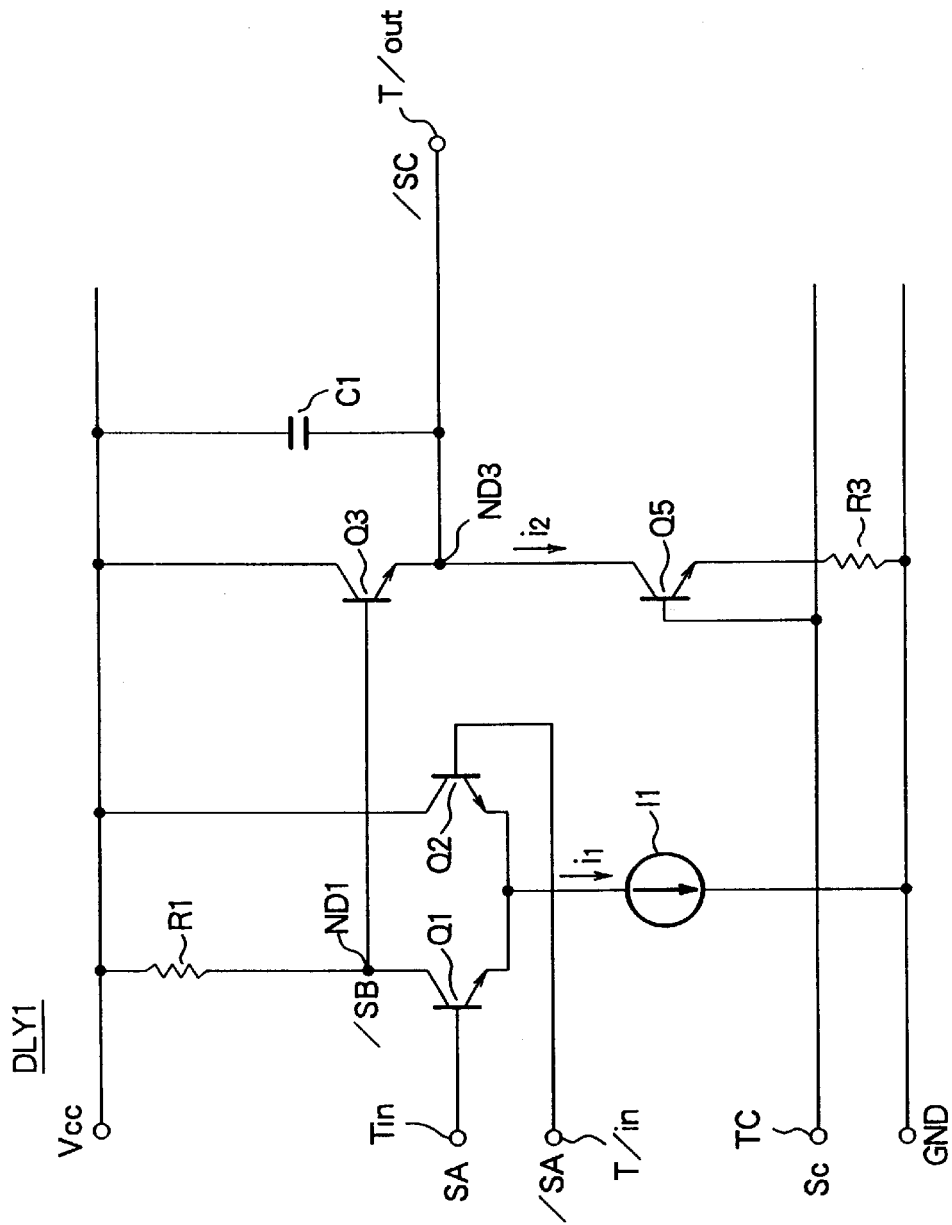
FIG. 4 is a circuit diagram of an inverting delay circuit constituting an oscillator circuit according to a first embodiment of the present invention.
Figures 5A, 5B, 5C, 5D:
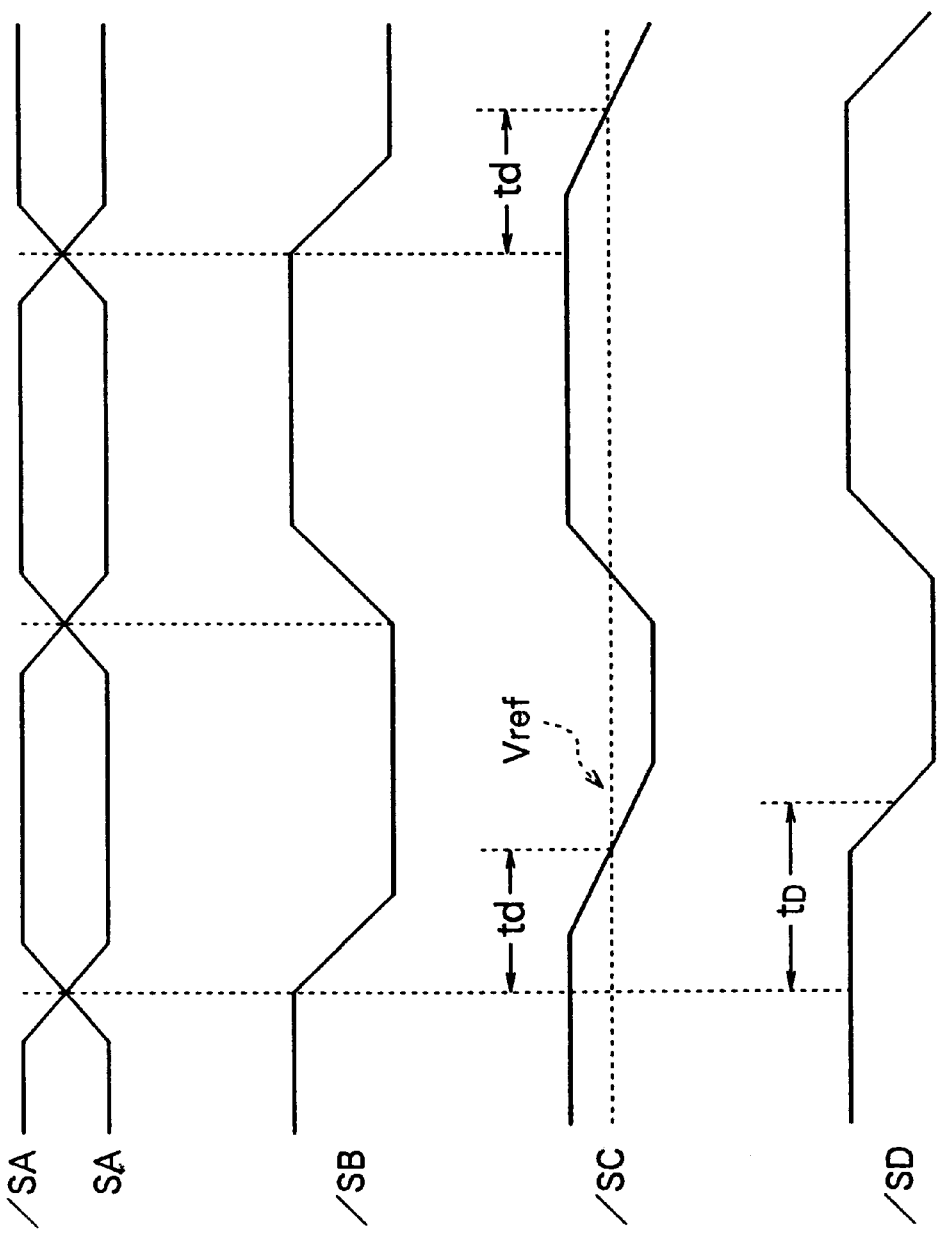
FIGS. 5A to 5D are signal waveform diagrams of the operation of the oscillator circuit of FIG. 4.

FIG. 4 is a circuit diagram of the configuration of an inverting delay circuit DLY1 of a constituent element of the oscillator circuit according to the present invention.

As illustrated, the inverting delay circuit DLY1 is constituted by inverting elements comprising differential amplifier circuits and delay elements comprising emitter followers and capacitors.

The differential amplifier circuit is constituted by the transistors Q1 and Q2, the resistance element R1, and the current source I1. Bases of the transistors Q1 and Q2 are respectively connected to the input terminals Tin and T/in, the collector of the transistor Q1 is connected to the supply line of the power supply voltage $V_{CC}$ via the resistance element R1, and the collector of the transistor Q2 is connected to the supply line of the power supply voltage $V_{CC}$. The emitters of the transistors Q1 and Q2 are commonly connected to the current source I1. The connection node ND1 of the collector of the transistor Q1 and the resistance element R1 constitutes the inverting output node with respect to the input terminal Tin of the differential amplifier circuit. The current $i_1$ is supplied by the current source I1.

In the delay element, the base of the transistor Q3 is connected to the node ND1, and the emitter is connected to the node ND3. The capacitor C1 is connected between the node ND3 and the supply line of the power supply voltage $V_{CC}$. The base of the transistor Q5 is connected to the input terminal Tc of the control signal Sc, the collector is connected to the node ND3, and the emitter is grounded via the resistance element R3.

To the input terminals Tin and T/in, the input signal SA and the inverted signal /SA thereof are respectively input. The voltage of the node ND1 changes in accordance with the input signal SA and becomes the inverted signal /SB of the input signal SA. The output signal /SC of the delay circuit changes in its level in accordance with the output signal /SB of the differential amplifier circuit. For example, when the signal /SB becomes a low level, the transistor Q3 becomes the off state, the capacitor C1 is charged by the collector current $i_2$ of the transistor Q5, and the voltage of the node ND3 gradually falls. Here, if the resistance value of the resistance element R1 is R, the amplitude of the collector of the transistor Q1 becomes $(R \cdot i_1)$. The low level of the node ND3 becomes $(V_{CC} - Vf - R \cdot i_1)$. Note that, Vf is the base-emitter voltage of the transistor Q3. When the signal /SB switches from a low level to high level, the transistor Q3 switches from the off state to the on state, the capacitor C1 discharges via the transistor Q3, and the voltage of the node ND3 rises. The high level voltage of the node ND3 becomes $(V_{CC} - Vf)$.

When the charging current $i_2$ of the capacitor C1 is set small, the fall in level of the node ND3 at the time of charging becomes gentle. Namely, the rising edge of the node ND3 is sharp, and the trailing edge is gentle.

FIGS. 5A to 5D show the signal waveform at the operation of the delay circuit shown in FIG. 4. Below, an explanation will be made of the operation of the inverting delay circuit DLY1 of the present example by referring to the waveform diagrams of FIGS. 5A to 5D.

As illustrated, the signal /SB of the node ND1 is the inverted signal of the input signal SA. The level of the output signal /SC of the delay circuit is set in accordance with the signal /SB of the node ND1. By the trailing edge of the signal /SB, the transistor Q3 switches from the on state to the off state, and the capacitor C1 is charged in accordance with the current $i_2$, therefore the signal /SC switches from a high level to a low level with gentle trailing edge. Then, by the rising edge of the signal /SB, the transistor Q3 switches from the off state to the on state and the capacitor C1 discharges via the transistor Q3, therefore the signal /SC quickly rises and is held at a high level. With respect to the rising edge of the input signal SA, the delay time of the trailing edge of the output signal /SC becomes td as illustrated.

Note that, with respect to the trailing edge of the input signal SA, the delay circuit DLY1 of the present example gives only a delay time of the inverting element comprising the differential amplifier circuit, therefore there is only a very short delay. Namely, by the inverting delay circuit of the present example, the delay time is given to only the rising edge of the input signal SA and a signal /SC falling a time lag td from the rising edge of the input signal SA is output. Conversely, a signal /SC rising with only a very short delay time from the trailing edge of the input signal SA is output.

By comparing the output signal /SC of the delay circuit with the reference voltage $V_{ref}$ by a not illustrated comparison circuit, a signal /SD delayed with respect to the input signal SA of the delay circuit is obtained. For example, as shown in FIGS. 5A to 5D, if the reference voltage $V_{ref}$ is set to a half of the maximum level of the output signal /SC of the delay circuit, as a result of comparison of the output signal /SC of the delay circuit and the reference voltage $V_{ref}$, an illustrated signal /SD is obtained. The result of comparison /SD is inverted and delayed in comparison with the input signal SA of the delay circuit.

Here, for example, when the capacitance of the capacitor C1 is C, the current value of the charging current $i_2$ of the capacitor C1 is I, and the voltage difference from the maximum level of the signal /SC to the reference voltage $V_{ref}$ is V, the delay time td of the delay circuits is found by following equation:

$$td = C \times V / I \quad (1)$$

Note that, it is also possible to constitute the delay circuit by combining the delay circuit DLY1 shown in FIG. 4 and a not illustrated comparison circuit. The delay time of the delay circuit in this case, that is, the delay time from the rising edge of the input signal SA to the trailing edge of the output signal /SD, becomes the sum of the delay time td of the delay circuit DLY1 and the delay time of the comparison circuit and becomes $t_D$ as illustrated.

Above, an explanation was made of the configuration of the inverting delay circuit comprising the inverting element and the delay element, one of the basic circuits of the present invention, and the operation thereof. As mentioned above, the inverting delay circuit of the present embodiment inverts the input signal and further delays this, whereby a delayed signal inverted with respect to the input signal is obtained. The collector current $i_2$ of the transistor Q5 can be controlled by controlling the level of the control signal Sc input to the input terminal Tc, the charging current of the capacitor C1 can be controlled in accordance with this, and the delay time of the delay element can be controlled. For this reason, the control property of the delay time in the inverting delay circuit of the present embodiment is good and the range of variation of the delay time can be set wide.

Below, an explanation will be made of another basic circuit of the present invention, i.e., the non-inverting delay circuit, by referring to FIG. 6 and FIGS. 7A to 7C.

Second Embodiment

Figure 6:
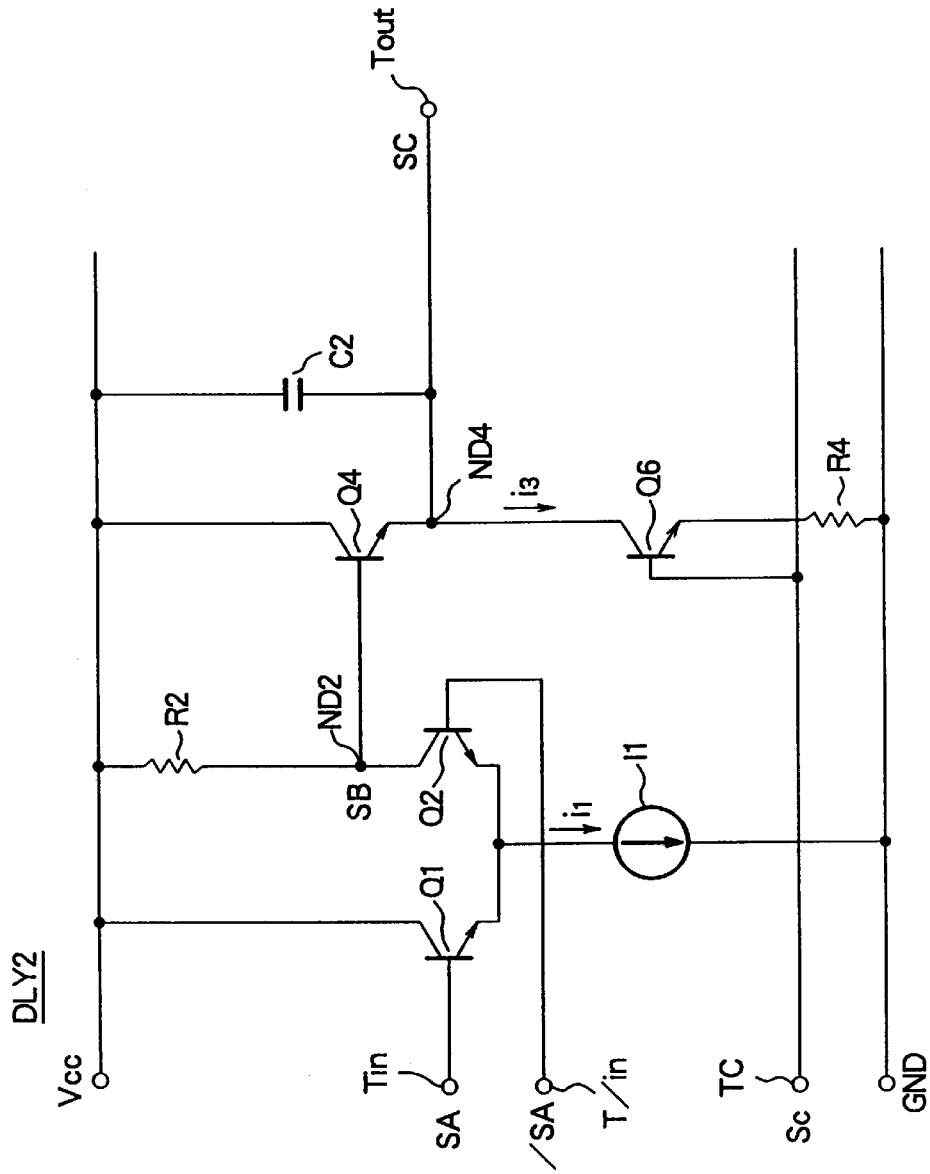
FIG. 6 is a circuit diagram of a non-inverting delay circuit constituting an oscillator circuit according to a second embodiment of the present invention.

FIG. 6 is a circuit diagram of the configuration of the non-inverting delay circuit DLY2 of another constituent element of the oscillator circuit according to the present invention.

As illustrated, the non-inverting delay circuit DLY2 is constituted by a non-inverting element (hereinafter referred to as a "buffer") comprising a differential amplifier circuit and a delay element comprising an emitter follower and a capacitor.

The differential amplifier circuit is constituted by the transistors Q1 and Q2, the resistance element R1, and the current source I1. Bases of the transistors Q1 and Q2 are respectively connected to the input terminals Tin and T/in, the collector of the transistor Q2 is connected to the supply line of the power supply voltage $V_{CC}$ via the resistance element R2, and the collector of the transistor Q1 is connected to the supply line of the power supply voltage $V_{CC}$. The emitters of the transistors Q1 and Q2 are commonly connected to the current source I1. The connection node ND2 of the collector of the transistor Q2 and the resistance element R2 constitutes the non-inverting output node with respect to the input terminal Tin of the differential amplifier circuit. The current $i_1$ is supplied by the current source I1.

In the delay element, the base of the transistor Q4 is connected to the node ND2 and the emitter is connected to the node ND4. The capacitor C2 is connected between the node ND4 and the supply line of the power supply voltage $V_{CC}$. The base of the transistor Q6 is connected to the input terminal Tc of the control signal Sc, the collector is connected to the node ND4, and the emitter is grounded via the resistance element R4.

To the input terminals Tin and T/in, the input signal SA and the inverted signal /SA thereof are respectively input. The voltage of the node ND2 changes in accordance with the input signal SA and becomes the signal SB having the same phase as the input signal SA. The output signal SC of the delay circuit changes in level in accordance with the output signal SB of the differential amplifier circuit. For example, when the signal SB becomes a low level, the transistor Q4 becomes the off state, the capacitor C2 is charged by the collector current $i_3$ of the transistor Q6, and the voltage of the node ND4 gradually falls. Here, if the resistance value of the resistance element R2 is R, and the base-emitter voltage of the transistor Q4 is Vf, the low level of the node ND4 becomes ($V_{CC}-Vf-(R \cdot i_1)$). When the signal SB switches from a low level to a high level, the transistor Q4 switches from the off state to the on state, the capacitor C2 discharges via the transistor Q4, and the voltage of the node ND4 rises. The high level voltage of the node ND4 becomes ($V_{CC}-Vf$).

When the charging current $i_3$ of the capacitor C2 is set small, the rise of level of the node ND4 at the time of charging becomes gentle. Namely, the rising edge of the node ND4 is sharp, and the trailing edge is gentle.

FIGS. 7A to 7C show signal waveforms of the operation of the delay circuit shown in FIG. 6. Below, an explanation will be made of the operation of the non-inverting delay circuit DLY2 of the present example by referring to the circuit diagram of FIG. 6 and waveform diagrams of FIGS. 7A to 7C.

The level of the output signal SC of the delay circuit is set in accordance with the level of the input signal SA. Further, the level of the signal SB of the node ND2 is the same as that of the input signal SA. By the trailing edge of the signal SB, the transistor Q4 switches from the on state to the off state, and the capacitor C2 is charged in accordance with the current $i_3$, therefore the signal SC switches from a high level to a low level with a gentle trailing edge. Then, by the rising edge of the signal SB, the transistor Q4 switches from the off state to the on state, and the capacitor C2 discharges via the transistor Q4, therefore the signal SC quickly rises and is held at a high level. With respect to the trailing edge of the input signal SA, the delay time of the trailing edge of the output signal SC becomes td as illustrated. In FIGS. 7A to 7C, the waveform of the voltage SB of the node ND2 is omitted.

Note that, with respect to the rising edge of the input signal SA, the delay circuit DLY2 of the present example gives only the delay time of the inverting element comprising the differential amplifier circuit, therefore there is only a very short delay. Namely, by the non-inverting delay circuit of the present example, the delay time is given to only the trailing edge of the input signal SA, and the signal SC falling delayed by a time lag td from the trailing edge of the input signal SA is output. Conversely, a signal SC rising delayed by only a very short delay time from the rising edge of the input signal SA is output.

By comparing the output signal SC of the delay circuit with the reference voltage $V_{ref}$ by a not illustrated comparison circuit, a signal SD delayed with respect to the input signal SA of the delay circuit is obtained. For example, as shown in FIGS. 7A to 7C, if the reference voltage $V_{ref}$ is set to a half of the maximum level of the output signal SC of the delay circuit, as a result of comparison of the output signal SC of the delay circuit with the reference voltage $V_{ref}$, an illustrated signal SD is obtained. The result of comparison SD is delayed in comparison with the input signal SA of the delay circuit.

Here, for example, when the capacitance of the capacitor C2 is C, the current value of the charging current $i_3$ of the capacitor C2 is I, and the voltage difference from the maximum level of the signal SC to the reference voltage $V_{ref}$ of is V, the delay time td of the delay circuits is found by following equation:

$$td = C \times V / I \quad (2)$$

Note that, it is also possible to constitute the delay circuit by combining the delay circuit DLY2 shown in FIG. 6 and a not illustrated comparison circuit. The delay time of the delay circuit in this case, that is, the delay time from the rising edge of the input signal SA to the trailing edge of the output signal SD, becomes the sum of the delay time td of the delay circuit DLY2 and the delay time of the comparison circuit and becomes $t_D$ as illustrated.

Above, an explanation was given of the configuration of the non-inverting delay circuit DLY2 comprising the buffer and the delay element—one of the basic circuits of the present invention—and the operation thereof. As mentioned above, by the non-inverting delay circuit DLY2 of the present embodiment, the input signal SA is delayed and a delayed signal delayed by exactly the delay time $t_D$ is obtained. Further, in substantially the same way as the inverting delay circuit of the first embodiment, in the non-inverting delay circuit of the present embodiment, by controlling the level of the control signal Sc input to the input terminal Tc, the collector current $i_3$ of the transistor Q6 can be controlled, the charging current of the capacitor C2 can be controlled in accordance with this, and the delay time of the delay element can be controlled. For this reason, the control property of the delay time in the non-inverting delay circuit of the present embodiment is good, and the range of variation of the delay time can be set wide.

Third Embodiment

Below, an explanation will be made of a ring oscillator circuit constituted by using the inverting and non-inverting delay circuits of the basic circuits of the present invention mentioned above.

Figure 8A:
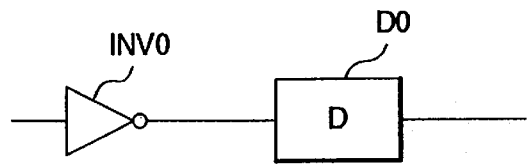
FIGS. 8A and 8B are circuit diagrams of an oscillator circuit according to a third embodiment of the present invention and equivalent circuits of an inverting delay circuit and a non-inverting delay circuit.
Figure 8B:
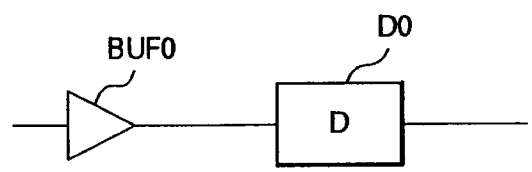

First, the equivalent circuit of the inverting delay circuit and the non-inverting delay circuit of the constituent elements of the present invention is as shown in FIGS. 8A and 8B.

The equivalent circuit of the inverting delay circuit is shown in FIG. 8A, and the equivalent circuit of the non-inverting delay circuit is shown in FIG. 8B. As illustrated, the inverting delay circuit is equivalently constituted by an inverter INV0 and a delay element D0. The inverter INV0 is constituted by for example a differential amplifier circuit as shown in FIG. 4, and the delay element D0 is constituted by for example an emitter follower and a capacitor and, further, the comparison circuit. The non-inverting delay circuit is equivalently constituted by a buffer BUF0 and the delay element D0. The buffer BUF0 is constituted by for example a differential amplifier circuit as shown in FIG. 6, and the delay element D0 is constituted by for example an emitter follower and capacitor.

Below, an explanation will be made of the configuration and operation of the oscillator circuit of the present invention by using the equivalent circuits of the inverting delay circuit and the non-inverting delay circuit shown in FIGS. 8A and 8B.

Figure 9:
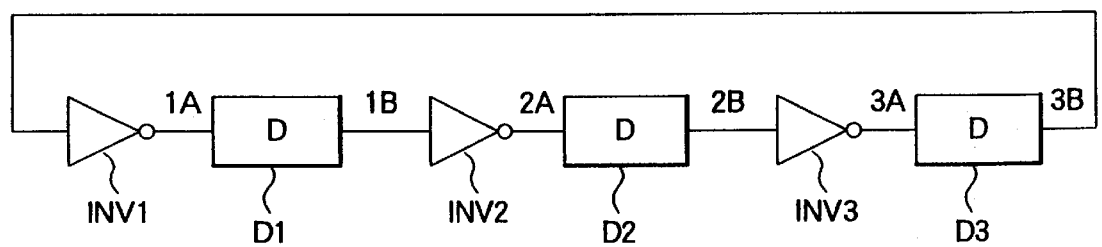
FIG. 9 is a circuit diagram of an oscillator circuit comprised of three stages of inverting delay circuits.
Figure 10:
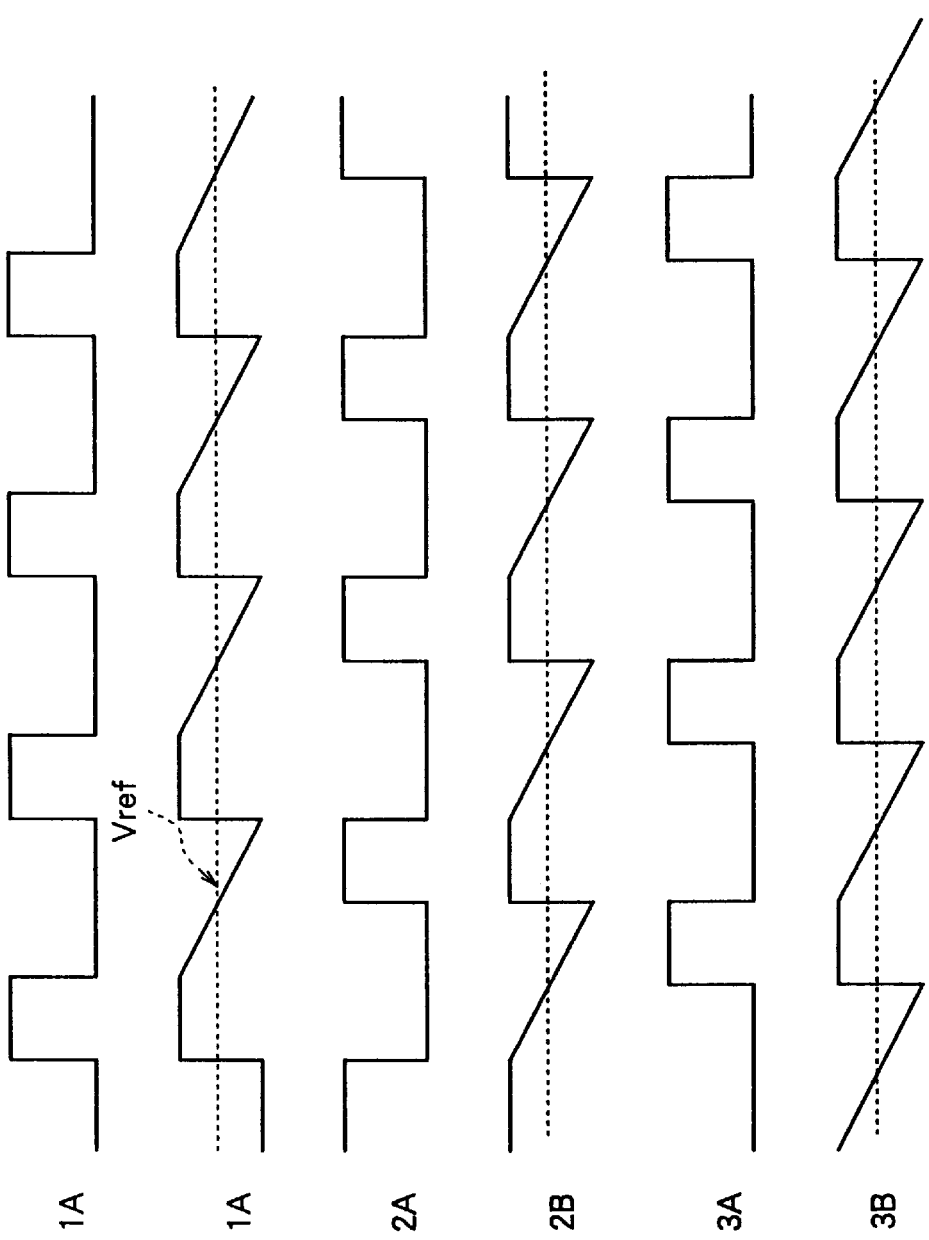
FIGS. 10A to 10F are waveform diagrams of the operation of the oscillator circuit of FIG. 9.

FIG. 9 is a circuit diagram of an oscillator circuit constituted by connecting three stages of inverting delay circuits in the form of a ring. As illustrated, the oscillator circuit of the present example is equivalently constituted by inverters INV1, INV2, and INV3 and delay elements D1, D2, and D3.

Each of the inverting delay circuit of the basic constituent element of the oscillator circuit is constituted by an inverter and a delay element connected to the output terminal thereof. These inverting delay circuits are connected in the form of a ring to constitute the oscillator circuit. Namely, the input terminal of the delay element D1 is connected to the output terminal of the inverter INV1, the input terminal of the inverter INV2 is connected to the output terminal of the delay element D1, the input terminal of the delay element D2 is connected to the output terminal of the inverter INV2, the input terminal of the inverter INV3 is connected to the output terminal of the delay element D2, and the input terminal of the delay element D3 is connected to the output terminal of the inverter INV3. Further, the output terminal of the delay element D3 is connected to the input terminal of the inverter INV1 to constitute the ring oscillator circuit.

Here, the output signal of the inverter INV1 is defined as 1A, the output signal of the delay element D1 is defined as 1B, the output signal of the inverter INV2 is defined as 2A, the output signal of the delay element D2 is defined as 2B, the output signal of the inverter INV3 is defined as 3A, and the output signal of the delay element D3 is defined as 3B. FIGS. 10A to 10F show waveforms of these signals.

Below, an explanation will be made of the operation of the oscillator circuit of the present example by referring to FIG. 9 and FIGS. 10A to 10F. Note that the waveforms of FIGS. 10A to 10F are for explaining the principle of operation of the ring oscillator circuit shown in FIG. 9. The delays of the signals in the inverters INV1 to INV3 are omitted. Also, the delays given to the rising edge of the input signal are omitted in each of the delay elements D1 to D3. Namely, in the waveform diagrams of FIGS. 10A to 10F, unlike the actual circumstance, the delay time is given to only the trailing edge of the input signals of the delay elements D1 to D3 for showing only the principle of operation of the oscillator circuit.

As illustrated, when the output signal 1A of the inverter INV1 is at a low level, in the delay element D1, the capacitor becomes the charged state, and the output signal 1B is held at a low level. When the signal 1A switches from a low level to a high level, the capacitor in the delay element D1 discharges, and the output signal 1B sharply rises.

Then, when the output signal 1A of the inverter INV1 switches from a high level to a low level, the capacitor of the delay element D1 is charged, and the output signal 1B of the delay element D1 gently falls.

The output signal 1B of the delay element D1 is compared with for example the reference voltage $V_{ref}$ by the comparison circuit. When the level of the output signal 1B is higher than the reference voltage $V_{ref}$, the result of comparison is held at a high level, while conversely, when the level of the output signal 1B is lower than the reference voltage $V_{ref}$, the result of comparison is held at a low level. The result of comparison is input to the inverter INV2, and the output signal 2A of the inverter INV2 becomes as illustrated. Further, the output signal 2B of the delay element D2 changes in accordance with the input signal 2A and becomes a signal having a sharp rising edge and gentle trailing edge. Output signals 3A and 3B of the inverter INV3 and the delay element D3 become substantially the same as those of the inverter and the delay element mentioned above.

As shown in FIGS. 10A to 10F, a clock signal having a duty ratio of 1:2 is obtained from either output terminal of the inverters INV1, INV2, and INV3. Namely, the oscillator circuit of the present example generates a clock signal having a duty ratio of 1:2. When a clock signal having a usual duty ratio of 1:1 is further generated, a clock signal of the duty ratio of 1:1 can be generated by dividing the frequency of the clock signal obtained by this oscillator circuit by for example two. Note, in this case, it is necessary to set the oscillation frequency of the oscillator circuit to a multiple of the frequency of the desired clock signal.

As explained above, according to the oscillator circuit of the present example, the oscillator circuit is constituted by using three stages of inverting delay circuits each comprising an inverter and a delay element and connecting them in the form of a ring so as to generate the clock signal. Note that the oscillation cycle of the oscillator circuit constituted in this way becomes the sum of the delay times of the inverting delay circuits. Here, for example, if all of the delay times of the inverting delay circuits of the three stages are $t_D$, the cycle of the clock signal of the oscillator signal becomes $6t_D$ and the oscillation frequency becomes $1/6t_D$.

Figure 11:
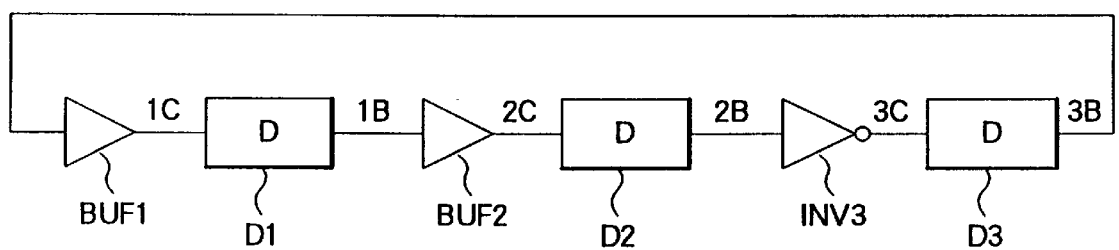
FIG. 11 is a circuit diagram of an oscillator circuit comprising two stages of non-inverting delay circuits and one stage of an inverting delay circuit.

FIG. 11 shows an example of an oscillator circuit constituted by an inverting delay circuit and non-inverting delay circuits. As illustrated, the oscillator circuit of the present example is constituted by connecting two stages of non-inverting delay circuits and one stage of inverting delay circuit in the form of a ring. The non-inverting delay circuits are constituted by buffers BUF1 and BUF2 and delay elements D1 and D2 connected to the output terminals of these buffers. The inverting delay circuit is constituted by the inverter INV3 and the delay element D3 connected to the output terminal thereof.

The constituent elements are connected in the form of a ring to constitute the oscillator circuit shown in FIG. 11. FIGS. 12A to 12F show the waveforms of parts at the oscillation operation of the oscillator circuit of the present example. Below, an explanation will be made of the operation of the oscillator circuit of the present example by referring to FIG. 11 and FIGS. 12A to 12F. As shown in FIGS. 12A to 12F, in accordance with the trailing edge of the buffer BUF1, the output signal 1B of the delay element D1 becomes a gentle trailing edge. Then, when the output signal 1C of the buffer BUF1 switches from a low level to a high level, the output signal 1B of the delay element D1 sharply rises.

The output signal 1B of the delay element D1 is compared by for example reference voltage $V_{ref}$. The result of comparison is held at a high level when it is at a level higher than the reference voltage $V_{ref}$, while the result of comparison is held at a low level when it is at a level lower than the reference voltage $V_{ref}$. The output signal 2C of the buffer BUF2 becomes as illustrated in accordance with the result of comparison. Then, the level of the output signal of the delay element D2 is set in accordance with the output signal 2C of the buffer BUF2. For example, by the trailing edge of the signal 2C, the output signal 2B of the delay element D2 gently falls, while by the rising edge of the signal 2C, the output signal 2B of the delay element D2 sharply rises.

Note, as shown in FIGS. 12A to 12F, the period of low level of the output signal 2C of the buffer BUF2 is short, therefore the capacitor located at the delay element D2 is not completely charged during this time, so the output signal of the delay element D2 cannot completely reach the low level, for example, the ground potential GND, and rises in the middle in accordance with the rising edge of the output signal 2C of the buffer BUF2. For this reason, it is considered that the output signal 2B of the delay element D2 starts to rise when it reaches for example near the level of the reference voltage $V_{ref}$ of the comparison circuit as illustrated. For this reason, the output signal of the comparison circuit becomes a pulse signal having a narrow width and unstable phase. Upon receipt of this result of comparison, the output signal 3C of the inverter INV3 becomes the pulse signal having an unstable phase as illustrated. As a result, the phase of the output signal 3B of the delay element D3 also becomes unstable. Namely, there is a possibility of occurrence of jitter in the clock signal generated by the oscillator circuit of the present example.

Figure 13A:
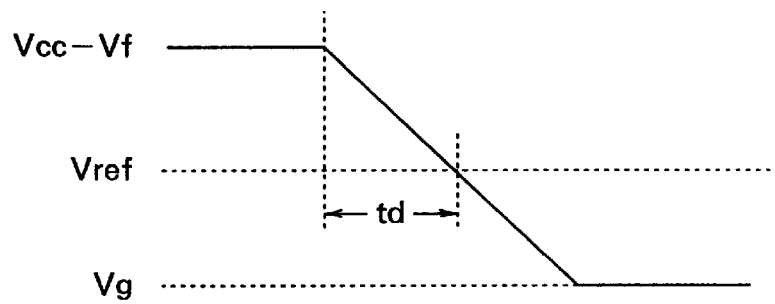
FIGS. 13A and 13B are waveform diagrams for explaining the principle of occurrence of jitter in an oscillator circuit.

Here, a detailed explanation will be made of the occurrence of jitter of the oscillator circuit by referring to FIGS. 13A and 13B. FIG. 13A is a waveform diagram of the output signal of the delay element of for example an inverting or non-inverting delay circuit. As illustrated, when the capacitor of the delay element is in the discharge state, the output signal is held at a high level, that is, the $(V_{CC}-Vf)$ level. Then, by the charging of the capacitor, the output signal of the delay element gently falls and reaches the low level, that is, the voltage Vg level. The time td until the output signal level of the delay element reaches the reference voltage $V_{ref}$ becomes the delay time of the delay circuit.

Figure 13B:
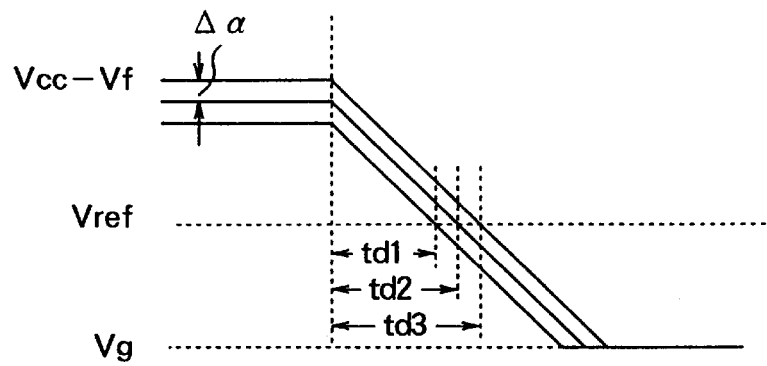

FIG. 13B is a waveform diagram of the output signal of the delay element when jitter occurs. As illustrated, where the first high level in the output signal of the delay element is in the unstable state, that is, the first high level is $(V_{CC}-Vf+\Delta\alpha)$, the delay time of the delay circuit changes to td1, td2, and td3 in accordance with this. For this reason, the oscillation frequency of the oscillator circuit becomes unstable, and jitter occurs.

In the oscillator circuit shown in FIG. 11, the high level of the output signal 3C of the inverter INV3 is unstable, the delay time of the delay element D3 becomes unstable in accordance with this, and jitter occurs in the oscillation frequency.

FIGS. 14A to 14L are waveform diagrams for explaining conditions under which the first high level of the delay element is held stable.

Here, the result of comparison of the output signal of the delay element and the reference voltage $V_{ref}$ is shown where the delay time of the delay circuit is td, and low level periods of the input signal of the delay element are 4td, 3td, 2td, and td.

Figure 14A:
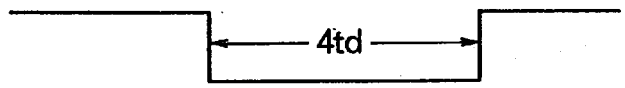
FIGS. 14A to 14L are waveform diagrams of an oscillator circuit with which a stable oscillation operation is obtained and the waveform diagrams when the jitter occurs.
Figure 14B:
Figure 14C:
Figure 14D:
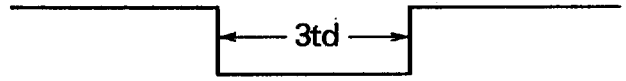
Figure 14E:
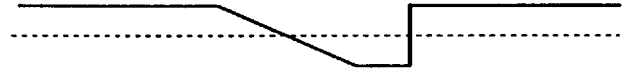
Figure 14F:
Figure 14G:
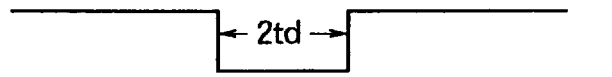
Figure 14H:
Figure 14I:

FIG. 14A shows an input signal having a low level period of 4td. The output signal of the delay element in accordance with this signal is shown in FIG. 14B, and, further, the result of comparison with the reference voltage $V_{ref}$ is shown in FIG. 14C. FIG. 14D shows an input signal having a low level period of 3td. The output signal of the delay element in accordance with this signal is shown in FIG. 14E, and, further, the result of comparison with the reference voltage $V_{ref}$ is shown in FIG. 14F. FIG. 14G shows an input signal having the low level period of 2td. An output signal of the delay element in accordance with this signal is shown in FIG. 14H, and, further, the result of comparison with the reference voltage $V_{ref}$ is shown in FIG. 14I.

Figure 14J:
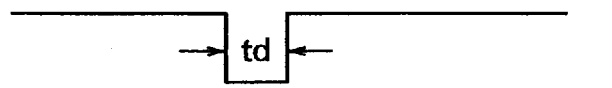
Figure 14K:
Figure 14L:

Further, FIG. 14J shows an input signal having a low level period of td. An output signal of the delay element is shown in FIG. 14K in accordance with this. As shown in FIG. 14K, when the output signal of the delay element is lowered by the charging of the capacitor and reaches the level of for example the reference voltage $V_{ref}$, the input signal rises and therefore the output signal starts to rise. For this reason, the result of comparison between the output signal and reference voltage $V_{ref}$ becomes a pulse signal having an unstable phase, and jitter occurs in the oscillation frequency of the oscillator circuit Further, where the level of the output signal of the delay element cannot reach the reference voltage $V_{ref}$, the result of comparison with the reference voltage $V_{ref}$ is held at a high level as shown in FIG. 14L, and a case where the oscillator circuit cannot oscillate may occur.

As explained above, in order for the oscillator circuit to generate a stable clock signal, the low level period of the signal input to the delay element must be held to at least 2td or more. When this condition is not satisfied, the oscillation frequency of the oscillator circuit becomes unstable or there is a possibility of occurrence of stoppage of oscillation in certain cases. In order to satisfy this condition, the number of stages of the inverting delay circuits connected in the form of the ring must be set to an odd number of three or more.

The oscillator circuit shown in FIG. 9 has the smallest configuration for satisfying the above condition. In the example of the oscillator circuit shown in FIG. 11, the number of stages of the inverting delay circuits is only one and does not satisfy the above condition, therefore a stable oscillation signal cannot be generated.

Below, an explanation will be made of other examples of oscillator circuits for satisfying this condition.

Figure 15:
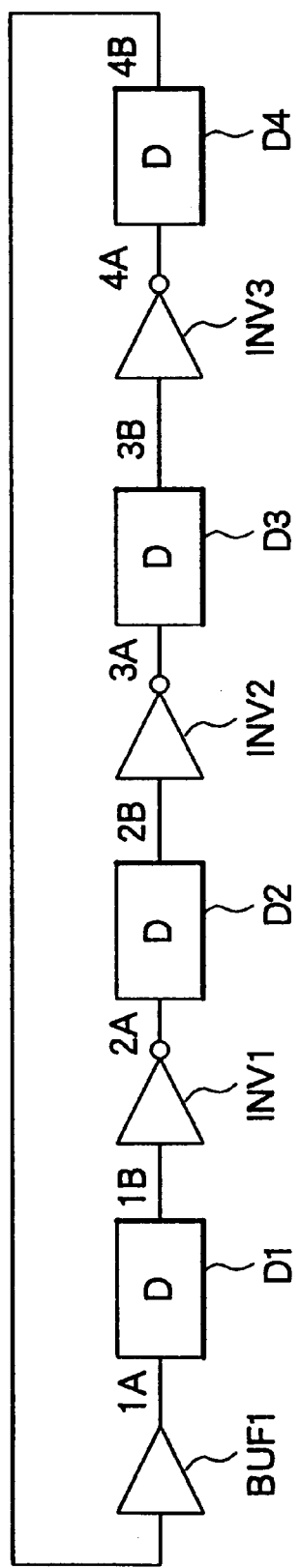
FIG. 15 is a circuit diagram of an oscillator circuit comprising one stage of a non-inverting delay circuit and three stages of inverting delay circuits.
Figures 16A, 16B, 16C, 16D, 16E, 16F, 16G, 16H:
FIGS. 16A to 16H are waveform diagrams of the operation of the oscillator circuit of FIG. 15.

FIG. 15 is a circuit diagram of an oscillator circuit constituted by one stage of non-inverting delay circuit and three stages of inverting delay circuits. As illustrated, the non-inverting delay circuit is constituted by the buffer BUF1 and the delay element D1, and the non-inverting delay circuits are constituted by the inverters INV1, INV2, and INV3 and the delay elements D2, D3, and D4.

These buffers, inverters, and delay elements are connected in the form of a ring to constitute the oscillator circuit. The output terminal of the buffer BUF1 is connected to the input terminal of the delay element D1, the output terminal of the delay element D1 is connected to the input terminal of the inverter INV1, the output terminal of the inverter INV1 is connected to the input terminal of the delay element D2, the output terminal of the delay element D2 is connected to the input terminal of the inverter INV2, and the output terminal of the inverter INV2 is connected to the input terminal of the delay element D3. The output terminal of the delay element D3 is connected to the input terminal of the inverter INV3, the output terminal of the inverter INV3 is connected to the input terminal of the delay element D4, and the output terminal of the delay element D4 is connected to the input terminal of the buffer BUF1.

Here, the output signal of the buffer BUF1 is 1A, the output signal of the delay element D1 is 1B, the output signal of the inverter INV1 is 2A, the output signal of the delay element D2 is 2B, the output signal of the inverter INV2 is 3A, the output signal of the delay element D3 is 3B, the output signal of the inverter INV3 is 4A, and the output signal of the delay element D4 is 4B. FIGS. 16A to 16H are waveform diagrams showing waveforms of these signals.

Below, an explanation will be made of the operation of the oscillator circuit of the present example by referring to FIG. 15 and FIGS. 16A to 16H.

When the output signal 1A of the buffer BUF1 switches from a high level to low level, the output signal 1B of the delay element D1 gently falls along with the charging of the capacitor. Then, the capacitor in the delay element D1 discharges in accordance with the rising edge of the output signal 1A of the buffer BUF1, and the output signal 1B of the delay element D1 abruptly rises in accordance with this. During the period where the output signal 1A of the buffer BUF1 is held at a high level, the output signal 1B of the delay element D1 is also held at a high level, for example, a level near the power supply voltage $V_{CC}$. Then, in accordance with the trailing edge of the output signal of the buffer BUF1, the output signal 1B of the delay element D1 gently falls.

When the output signal 1B of the delay element D1 is compared with for example the reference voltage $V_{ref}$ by the comparison circuit and the level of the output signal 1B is higher than the reference voltage $V_{ref}$, the result of comparison is held at a high level, while conversely when the level of the output signal 1B is lower than the reference voltage $v_{ref}$, the result of comparison is held at a low level. The result of comparison is input to the inverter INV1, and the output signal 2A of the inverter INV1 becomes as illustrated. Further, the output signal 2B of the delay element D2 changes in accordance with the input signal 2A and becomes a signal having a sharp rising edge and a gentle trailing edge. The output signals 3A, 3B, 4A, and 4B of the inverter INV3, delay element D3, inverter INV4, and delay element D4 become substantially the same as those of the inverters and delay elements.

As shown in FIGS. 16A to 16H, the output signal 1A of the buffer BUF1 and the output signal 3A of the inverter INV2 are clock signals of a duty ratio of 1:1. Further, the output signals 2A and 4A of the inverter INV1 and the inverter INV3 become clock signals of a duty ratio of 1:3.

Further, in the oscillator circuit of the present example, in the input signals 1A to 4A of the delay elements D1 to D4, when the period for which the signal is at a low level is at least 2td and, as mentioned above, the low level period of the input signal of the delay element is held at 2td or more, a stable oscillation signal without jitter is obtained by the oscillator circuit. For this reason, a stable clock signal can be generated by the oscillator circuit of the present example.

FIGS. 17 to 22J show examples of oscillator circuits constituted by five stages of inverting or non-inverting delay circuits and waveforms at operation in the oscillator circuits. Below, an explanation will be made of the configuration and operation of each by referring to these figures.

Figure 17:
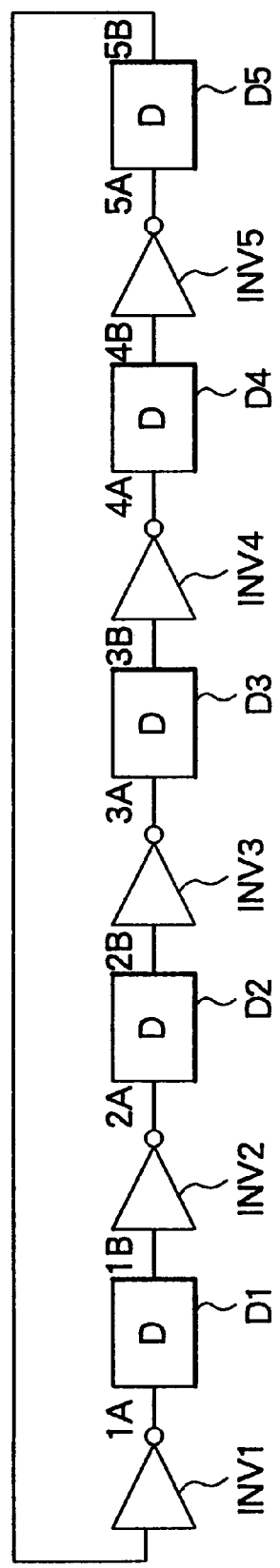
FIG. 17 is a circuit diagram of an oscillator circuit comprising five stages of inverting delay circuits.

FIG. 17 is a circuit diagram of an oscillator circuit constituted by five stages of inverting delay circuits. As illustrated, five stages of inverting delay circuits constituted by inverters INV1, INV2, . . . , and INV5 and delay elements D1, D2, . . . , and D5 connected to the output side of these inverters are connected in the form of a ring to constitute the oscillator circuit.

Here, when the output signals of the inverters INV1 to INV5 are 1A to 5A and output signals of the delay elements D1 to D5 are 1B to 5B, respectively, waveforms of these signals at the operation of the oscillator circuit are as shown in the waveform diagrams shown in FIGS. 18A to 18J.

Below, an explanation will be made of the operation of the oscillator circuit of the present example by referring to FIG. 17 and FIGS. 18A to 18J.

As illustrated, when the output signal 1A of the inverter INV1 is at a low level, in the delay element D1, the capacitor is in the charged state, and the output signal 1B is held at a low level. When the signal 1A switches from a low level to a high level, the capacitor in the delay element D1 discharges, and the output signal 1B sharply rises.

Then, when the output signal 1A of the inverter INV1 switches from a high level to a low level, the capacitor of the delay element D1 is charged, and the output signal 1B of the delay element D1 gently falls.

The output signal 1B of the delay element D1 is compared with for example the reference voltage $V_{ref}$ by the comparison circuit. When the level of the output signal 1B is higher than the reference voltage $V_{ref}$ the result of comparison is held at a high level, while conversely when the level of the output signal 1B is lower than the reference voltage $V_{ref}$, the result of comparison is held at a low level. The result of comparison is input to the inverter INV2, and the output signal 2A of the inverter INV2 becomes as illustrated. Further, the output signal 2B of the delay element D2 changes in accordance with the input signal 2A and becomes a signal having a sharp rising edge and a gentle trailing edge.

The output signals 3A, 4Am and 5A and 3B, 4B, and 5B of the inverters INV3, INV4, and INV5 and the delay elements D3, D4, and D5 become substantially the same as those of the inverters and delay elements mentioned above.

As shown in FIGS. 18A to 18J, a clock signal of a duty ratio of 2:3 is obtained from the output terminal of each of the inverters INV1 to INV5 of the oscillator circuit. Namely, the period of low level of the signal input to the delay elements D1 to D5 is 3td. For this reason, a stable oscillation operation is carried out by the oscillator circuit of the present example, and a stable clock signal without jitter is generated.

Figure 19:
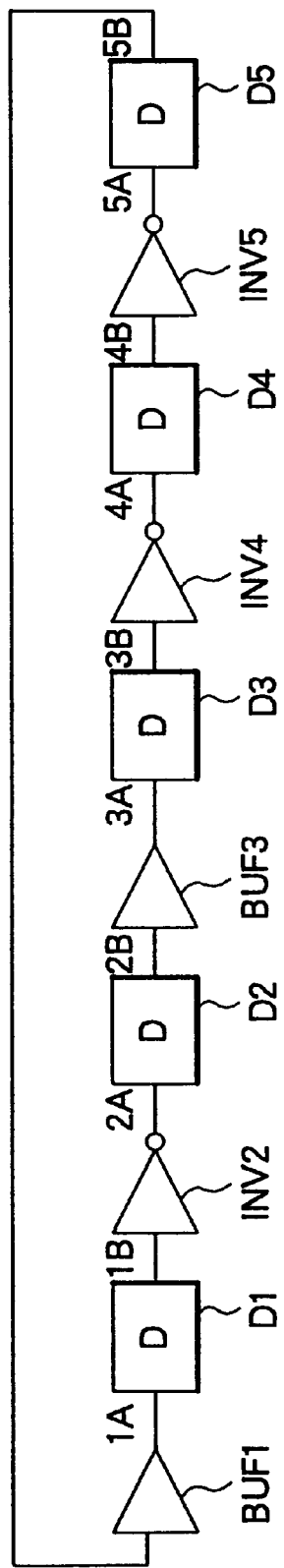
FIG. 19 is a circuit diagram of an oscillator circuit comprising two stages of non-inverting delay circuits and three stages of inverting delay circuits.

FIG. 19 is a circuit diagram of an oscillator circuit constituted by two stages of non-inverting delay circuits and three stages of inverting delay circuits. As illustrated, the oscillator circuit of the present example is constituted by non-inverting delay circuits comprising buffers BUF1 and BUF2 and delay elements D1 and D3 and by inverting delay circuits comprising inverters INV1, INV2, and INV3 and delay elements D2, D4, and D5. These non-inverting and inverting delay circuits are connected in the form of a ring to constitute the oscillator circuit.

Concretely, the output terminal of the buffer BUF1 is connected to the input terminal of the delay element D1, and the output terminal of the delay element D1 is connected to the input terminal of the inverter INV1. The output terminal of the inverter INV1 is connected to the input terminal of the delay element D2, the output terminal of the delay element D2 is connected to the input terminal of the buffer BUF2, and the output terminal of the buffer BUF2 is connected to the input terminal of the delay element D3. The output terminal of the delay element D3 is connected to the input terminal of the inverter INV2, and the output terminal of the inverter INV2 is connected to the input terminal of the delay element D4. The output terminal of the delay element D4 is connected to the input terminal of the inverter INV3, and the output terminal of the inverter INV3 is connected to the input terminal of the delay element D5. Then, the output terminal of the delay element D5 is connected to the input terminal of the buffer BUF1 to constitute the ring oscillator circuit.

Here, when the output signal of the buffer BUF1 is 1A, the output signal of the inverter INV1 is 2A, the output signal of the buffer BUF2 is 3A, output signals of the inverters INV2 and INV3 are 4A and 5A, and further output signals of the delay elements D1 to D5 are 1B to 5B, respectively, the waveforms of these signals at the operation of the oscillator circuit are shown in FIGS. 20A to 20J. Below, an explanation will be made of the operation of the oscillator circuit of the present example by referring to the waveforms of FIGS. 20A to 20J.

As illustrated, when the output signal 1A of the buffer BUF1 is at a high level, at the delay element D1, the capacitor is in the discharge state, and the output signal 1B is held at a high level. When the signal 1A switches from a high level to a low level, the capacitor in the delay element D1 is charged, and the output signal 1B gently falls.

Then, when the output signal 1A of the buffer BUF1 switches from a low level to high level, the capacitor of the delay element D1 abruptly discharges, and the output signal 1B of the delay element D1 rises with a sharp rising edge.

The output signal 1B of the delay element D1 is compared with for example the reference voltage $V_{ref}$ by the comparison circuit. When the level of the output signal 1B is higher than the reference voltage $V_{ref}$, the result of comparison is held at a high level, while conversely when the level of the output signal 1B is lower than the reference voltage $V_{ref}$, the result of comparison is held at a low level. The result of comparison is input to the inverter INV1, and the output signal 2A of the inverter INV1 becomes as shown in FIG. 20C. Further, the output signal 2B of the delay element D2 changes in accordance with the input signal 2A and becomes a signal having a sharp rising edge and gentle trailing edge.

The output signals 3A, 4A, and 5A and 3B, 4B, and 5B of the buffer BUF2 and inverters INV2 and INV3 and the delay elements D3, D4, and D5 connected to the output side of the delay element D2 become substantially the same as those of the buffer BUF1, inverter INV1, and the delay elements D1 and D2.

As shown in FIGS. 20A to 20J, clock signals of duty ratios 1:4, 2:3, and 3:2 are obtained from the output terminals of the buffers BUF1 and BUF2 and the inverters INV1, INV2, and INV3 of the oscillator circuit. Namely, the period of low level of the signal input from the delay elements D1 to D5 is 2td at the smallest. For this reason, a stable oscillation operation is carried out by the oscillator circuit of the present example, and a stable clock signal without jitter is generated.

Figure 21:
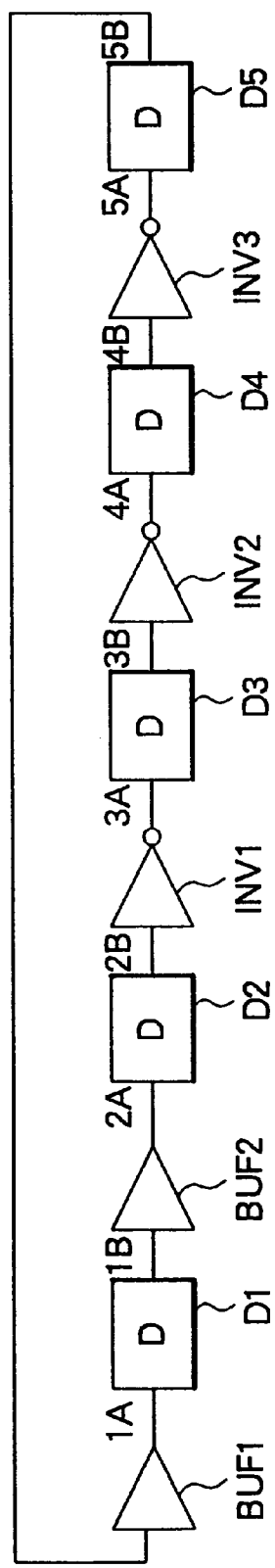
FIG. 21 is a circuit diagram of another example of the configuration of an oscillator circuit comprising two stages of non-inverting delay circuits and three stages of inverting delay circuits.

FIG. 21 is a circuit diagram of one another example of an oscillator circuit constituted by two stages of non-inverting delay circuits and three stages of inverting delay circuits. As illustrated, the constituent elements of the oscillator circuit of the present example are the same as those of the oscillator circuit shown in FIG. 19, but the connection of inverting and non-inverting delay circuits is different from that of the example of FIG. 19. In the present example, two stages of non-inverting delay circuits are connected in series, and also three stages of inverting delay circuits are connected in series.

As illustrated, the output terminal of the buffer BUF1 is connected to the input terminal of the delay element D1, the output terminal of the delay element D1 is connected to the input terminal of the buffer BUF2, and the output terminal of the buffer BUF2 is connected to the input terminal of the delay element D2. The output terminal of the delay element D2 is connected to the input terminal of the inverter INV1, the output terminal of the inverter INV1 is connected to the input terminal of the delay element D3, and the output terminal of the delay element D3 is connected to the input terminal of the inverter INV2. The output terminal of the inverter INV2 is connected to the input terminal of the delay element D4, the output terminal of the delay element D4 is connected to the input terminal of the inverter INV3, and the output terminal of the inverter INV3 is connected to the input terminal of the delay element D5. Further, the output terminal of the delay element D5 is connected to the input terminal of the buffer BUF1 to constitute the ring oscillator circuit.

Here, where the output signal of the buffer BUF1 is 1A, the output signal of the buffer BUF2 is 2A, and output signals of the inverters INV1, INV2, and INV3 are 3A, 4A, and 5A and further output signals of the delay elements D1 to D5 are 1B to 5B, respectively, waveforms of these signals at the operation of the oscillator circuit are shown in FIGS. 22A to 22J. Below, an explanation will be made of the operation of the oscillator circuit of the present example by referring to the waveform diagrams of FIGS. 22A to 22J.

As illustrated, when the output signal 1A of the buffer BUF1 is a high level, in the delay element D1, the capacitor is in the discharged state, and the output signal 1B is held at a high level. When the signal 1A switches from a high level to a low level, the capacitor in the delay element D1 is charged, and the output signal 1B gently falls.

Then, when the output signal 1A of the buffer BUF1 switches from a low level to a high level, the capacitor of the delay element D1 abruptly discharges, and the output signal 1B of the delay element D1 rises with a sharp rising edge.

Figure 22A:
FIGS. 22A to 22J are waveform diagrams of the operation of the oscillator circuit of FIG. 21.
Figure 22B:
Figure 22C:
Figure 22D:
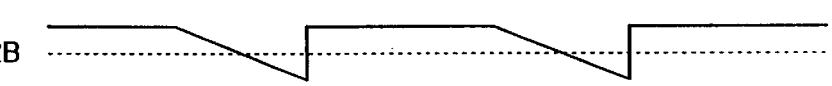
Figure 22E:
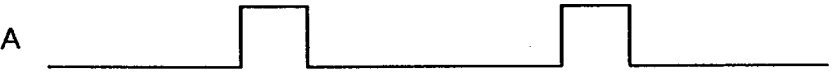
Figure 22F:
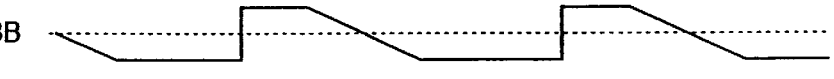
Figure 22G:
Figure 22H:
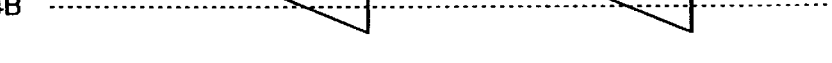
Figure 22I:
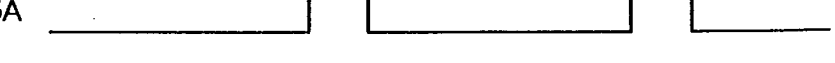
Figure 22J:

The output signal 1B of the delay element D1 is compared with for example the reference voltage $V_{ref}$ by the comparison circuit. When the level of the output signal 1B is higher than the reference voltage $V_{ref}$, the result of comparison is held at a high level, while conversely when the level of the output signal 1B is lower than the reference voltage $V_{ref}$, the result of comparison is held at a low level. The result of comparison is input to the buffer BUF2, and the output signal 2A of the buffer BUF2 becomes as shown in FIG. 22C. Further, the output signal 2B of the delay element D2 changes in accordance with the input signal 2A and becomes a signal having sharp rising edge and gentle trailing edge.

The output signals 3A, 4A, and 5A and 3B, 4B, and 5B of the inverters INV1, INV2, and INV3 and the delay elements D3, D4, and D5 connected to the output side of the delay element D2 are substantially the same as those of the buffers BUF1 and BUF2 and the delay elements D1 and D2. Note that the inverter outputs the inverted signal of the input signal.

As shown in FIGS. 22A to 22J, clock signals of duty ratios 1:4, 2:3, and 3:2 are obtained from the output terminals of the buffers BUF1 and BUF2 and the inverters INV1, INV2, and INV3 of the oscillator circuit. Namely, the period of low level of the signal input from the delay elements D1 to D5 is 2td at the smallest. For this reason, a stable oscillation operation is carried out by the oscillator circuit of the present example, and a stable clock signal without jitter is generated.

Below, examples of the configurations of oscillator circuits of three stages, four stages, five stages, and six stages of inverting and non-inverting delay circuits will be shown together by referring to FIGS. 23A to 27E.

Figure 23A:
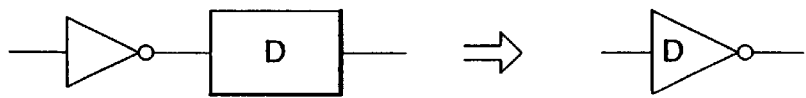
FIGS. 23A and 23B are views of the symbols of the inverting and non-inverting delay circuits.
Figure 23B:

FIGS. 23A and 23B show simplified symbols of the inverting and non-inverting delay circuits. Below, structural examples of the oscillator circuit will be shown in FIGS. 24 to 27E by using these symbols.

Figure 24:
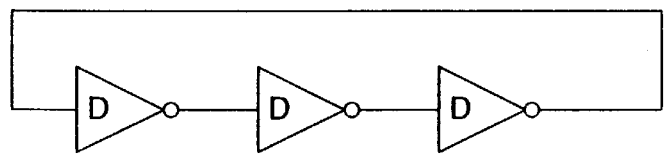
FIG. 24 is a circuit diagram of an oscillator circuit comprising three stages of inverting delay circuits.

First, FIG. 24 is a circuit diagram of an oscillator circuit constituted by three stages of inverting delay circuits. Note that, the present example of the circuit has a similar configuration to that of the example of the oscillator circuit shown in FIG. 9. As mentioned above, an oscillator circuit constituted by three stages of inverting delay circuits has the simplest configuration among the oscillator circuits of the present invention. By this oscillator circuit, a clock signal of a duty ratio of 1:2 can be generated, and the oscillation operation stably carried out.

Figure 25:
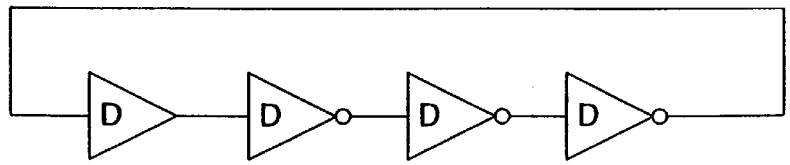
FIG. 25 is a circuit diagram of an oscillator circuit of a four-stage structure comprising one stage of a non-inverting delay circuit and three stages of inverting delay circuits.

FIG. 25 is a circuit diagram of an oscillator circuit of a four-stage configuration constituted by one stage of non-inverting delay circuit and three stages of inverting delay circuits. Note that the present example of circuit has a similar configuration to that of the example of the oscillator circuit shown in FIG. 15. As mentioned above, by the oscillator circuit constituted by one stage of non-inverting delay circuit and three stages of inverting delay circuits, two types of clock signals of 1:3 and 2:2 can be generated, and the oscillation operation stably carried out.

Figure 26A:
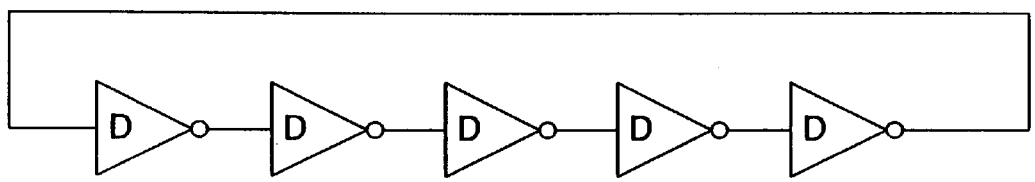
FIGS. 26A to 26C are circuit diagrams of three examples of oscillator circuits of five-stage structures.
Figure 26B:
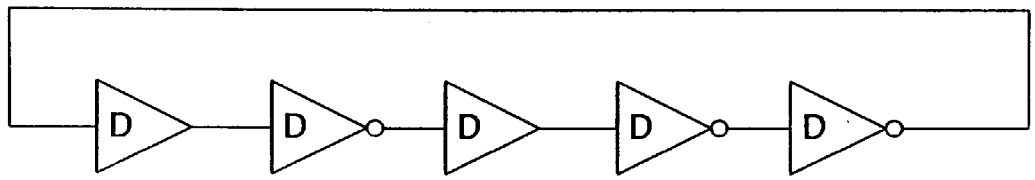
Figure 26C:
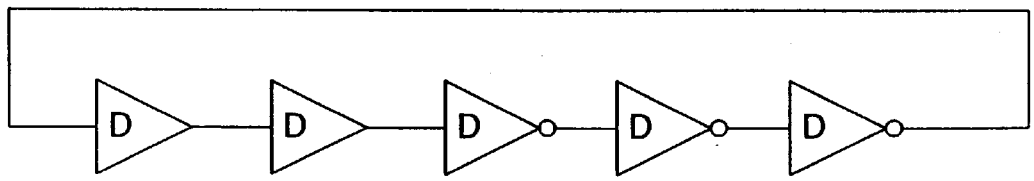

FIGS. 26A to 26C are circuit diagrams of oscillator circuits of five-stage configurations constituted by five stages of inverting delay circuits or two stages of non-inverting delay circuits and three stages of inverting delay circuits. As illustrated, there are three types of configurations of an oscillator circuit of a five-stage configuration. FIGS. 26A, 26B, and 26C show these configurations. Note that these examples of circuits have similar configurations to those of the examples of the oscillator circuits shown in FIG. 17, FIG. 19, and FIG. 21. As mentioned above, by these five-stage-configuration oscillator circuits, three types of clock signals of 1:3, 2:3, and 3:2 can be generated, and the oscillation operation stably carried out.

Figure 27A:
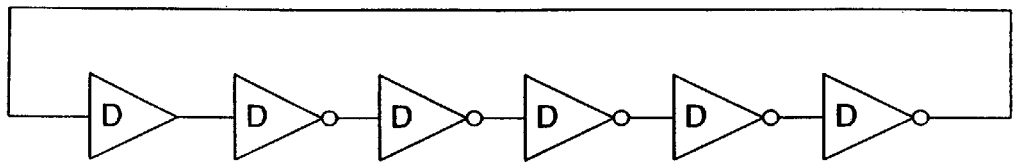
FIGS. 27A to 27E are circuit diagrams of five examples of oscillator circuits of six-stage structures.
Figure 27B:
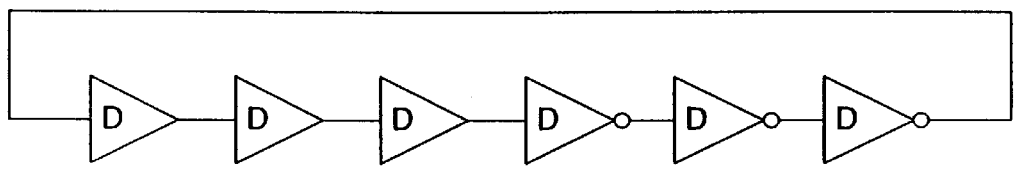
Figure 27C:
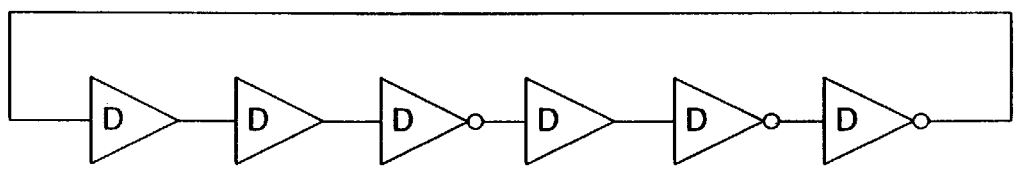
Figure 27D:
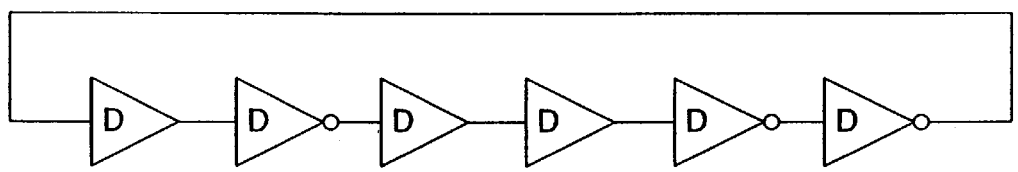
Figure 27E:
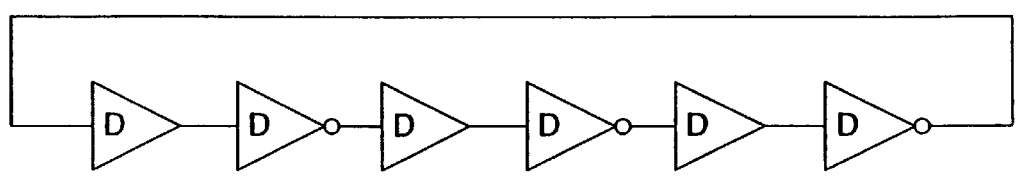

FIGS. 27A to 27E show five examples of configurations of an oscillator circuit of a six-stage configuration. FIG. 27A is a circuit diagram of an oscillator circuit constituted by one stage of non-inverting delay circuit and five stages of inverting delay circuits, while FIGS. 27B to 27E are circuit diagrams of oscillator circuits each being constituted by three stages of non-inverting delay circuits and three stages of inverting delay circuits. As illustrated, there are four configurations of oscillator circuit constituted by using three stages of non-inverting and three stages of inverting delay circuits depending on the connection configuration of the constituent elements of the circuit. Here, an explanation of the detailed operation of these oscillator circuits will be omitted. Note, by these oscillator circuits of six-stage configurations, a clock signal of cycle 12td is generated and a stable oscillation operation obtained in each example of configuration.

Fourth Embodiment

FIGS. 28 to 31F are circuit diagrams and waveform diagrams of another embodiment of the oscillator circuit of the present invention. Below, an explanation will be made of the configuration and operation of these examples of circuits by referring to these figures. Note that in each example of configuration the oscillator circuit of the present invention explained heretofore, the output signal of the delay element of each stage was compared with the reference voltage $V_{ref}$, and the result of comparison was supplied to the next stage as the input signal of the next stage. The reference voltage $V_{ref}$ was set to a half of the maximum level of the output signal of the delay element, but the present invention is not limited to this. The level of the reference voltage $V_{ref}$ in the comparison circuit can be freely set.

Figure 28:
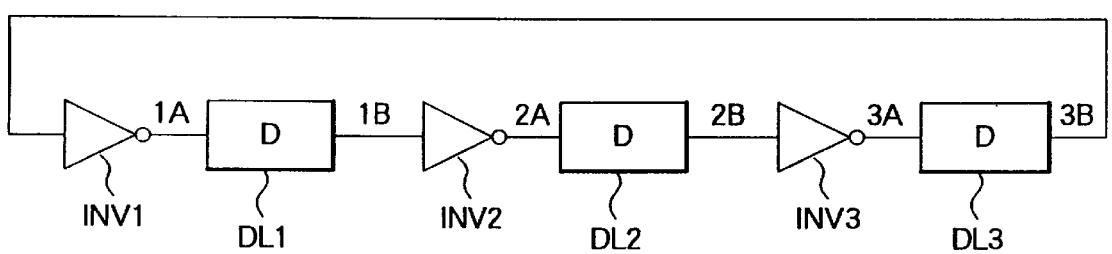
FIG. 28 is a circuit diagram of an oscillator circuit according to a fourth embodiment of the present invention and a circuit diagram of an oscillator circuit comprising three stages of inverting delay circuits.

FIG. 28 is a circuit diagram of an oscillator circuit constituted by three stages of inverting delay circuits. As illustrated, the oscillator circuit of the present example is constituted by inverters INV1, INV2, and INV3 and delay elements DL1, DL2, and DL3. These inverters and delay elements are connected in the form of a ring to constitute the oscillator circuit.

More specifically, the output terminal of the inverter INV1 is connected to the input terminal of the delay element DL1, the output terminal of the delay element DL1 is connected to the input terminal of the inverter INV2, the output terminal of the inverter INV2 is connected to the input terminal of the delay element DL2, the output terminal of the delay element DL2 is connected to the input terminal of the inverter INV3, and the output terminal of the inverter INV3 is connected to the input terminal of the delay element DL3. Further, the output terminal of the delay element DL3 is connected to the input terminal of the inverter INV1 to constitute the ring oscillator circuit.

The delay elements DL1, DL2, and DL3 are provided with for example comparison circuits, the output signal of the delay element and the reference voltage $V_{ref1}$ are compared by these comparison circuits, and the level of the output signal is set in accordance with the result of the comparison.

Here, when the output signals of the inverters INV1 to INV3 are 1A to 3A and the output signals of the delay elements DL1 to DL3 are 1B to 3B, waveforms of signals of the operation of the oscillator circuit of the present example are shown in FIGS. 29A to 29F. Below, an explanation will be made of the operation of the oscillator circuit of the present example by referring to FIG. 28 and FIGS. 29A to 29F.

As illustrated, when the output signal 1A of the inverter INV1 is at a high level, the output signal 1B of the delay element DL1 is also held at a high level, the capacitor in the delay element DL1 is charged in accordance with the trailing edge of the signal 1A, and the output signal of the delay element DL1 gently falls. Then, the capacitor of the delay element DL1 discharges in accordance with the rising edge of the output signal 1A of the inverter INV1, and the output signal 1B of the delay element DL1 rises with a sharp rising edge.

The inverters INV2 and INV3 and the delay elements DL2 and DL3 operate in substantially the same way as the above inverter INV1 and delay element DL1.

As shown in FIGS. 29A to 29F, the level of the reference voltage $V_{ref1}$ to be compared with the output signals of the delay elements DL1 to DL3 is set to not a half of the maximum output level of these delay elements, but a value other than this. For example, if the maximum level of the output signal of the delay element is $V_{TP}$, the level of the reference voltage $V_{ref1}$ is set to $3V_{TP}/4$, that is, set to ¾ of the maximum level.

When the level of the output signal of the delay element is larger than the reference voltage $V_{ref1}$, a signal of a high level is output by the comparison circuit, while conversely, when the level of the output signal of the delay element is smaller than the reference voltage $V_{ref1}$, a signal of a low level is output by the comparison circuit. The output signal of the comparison circuit is input to the delay circuit of the next stage, inverted by the inverter, and further input to the delay element of the delay circuit of the next stage.

In this way, by changing the level of the reference voltage $V_{ref1}$ in the comparison circuit, the oscillation frequency of the oscillator circuit changes. As in the present example, by setting the reference voltage $V_{ref1}$ larger than a half of the maximum level, the delay time in the delay element is reduced, therefore the oscillation cycle of the oscillator circuit is reduced in accordance with this, that is, the oscillation frequency becomes large.

Above, the explanation was given of the case where the level of the reference voltage was set large. Below, an explanation will be made of the operation of the oscillator circuit when the reference voltage is set low by referring to FIG. 30 and FIGS. 31A to 31F.

Figure 30:
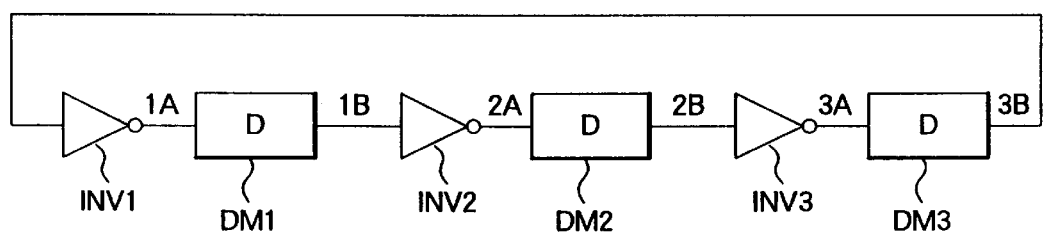
FIG. 30 is a circuit diagram of an oscillator circuit comprising three stages of inverting delay circuits.
Figure 31:
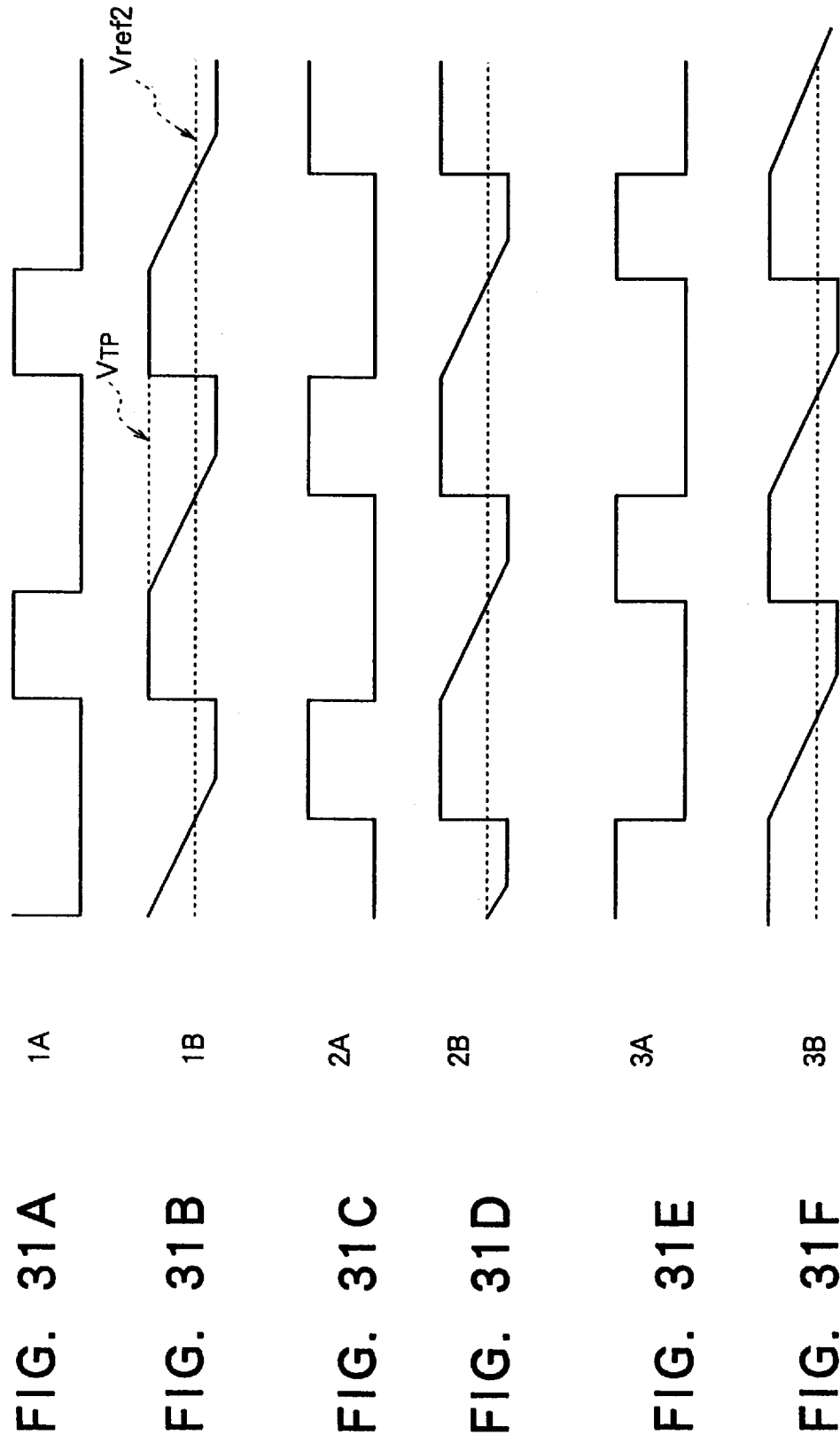
FIGS. 31A to 31F are waveform diagrams of the operation of an oscillator circuit where the reference voltage is set to ¼ of the maximum level.

As shown in FIG. 30, the oscillator circuit of the present example is constituted by connecting three stages of inverting delay circuits in the form of a ring in substantially the same way as the example of oscillator circuit shown in FIG. 28.

The inverting delay circuits are constituted by inverters INV, INV2, and INV3 and delay elements DM1, DM2, and DM3, respectively.

The output terminal of the inverter INV1 is connected to the input terminal of the delay element DM1, the output terminal of the delay element DM1 is connected to the input terminal of the inverter INV2, the output terminal of the inverter INV2 is connected to the input terminal of the delay element DM2, the output terminal of the delay element DM2 is connected to the input terminal of the inverter INV3, and the output terminal of the inverter INV3 is connected to the input terminal of the delay element DM3. Further, the output terminal of the delay element DM3 is connected to the input terminal of the inverter INV1 to constitute the ring oscillator circuit.

The delay elements DM1, DM2, and DM3 are provided with for example comparison circuits, the output signal of the delay element and the reference voltage $V_{ref1}$ are compared by these comparison circuits, and the level of the output signal is set in accordance with the result of the comparison.

Here, where the output signals of the inverters INV1 to INV3 are 1A to 3A, and the output signals of the delay elements DM1 to DM3 are 1B to 3B, the waveforms of the signals of the operation of the oscillator circuit of the present example are shown in FIGS. 31A to 31F. Below, an explanation will be made of the operation of the oscillator circuit of the present example by referring to FIG. 30 and FIGS. 31A to 31F.

As illustrated, when the output signal 1A of the inverter INV1 is at a high level, the output signal 1B of the delay element DM1 is also held at a high level, the capacitor at the delay element DM1 is charged in accordance with the trailing edge of the signal LA, and the output signal of the delay element DM1 gently falls. Then, the capacitor of the delay element DM1 discharges in accordance with the rising edge of the output signal 1A of the inverter INV1, and the output signal 1B of the delay element DM1 rises with a sharp rising edge.

The inverters INV2 and INV3 and delay elements DM2 and DM3 operate in substantially the same way as the inverter INV1 and delay element DM1 mentioned above.

As shown in FIGS. 31A to 31F, if the maximum level of the output signal of the delay element is $V_{TP}$, the level of the reference voltage $V_{ref2}$ to be compared with the output signals of the delay elements DM1 to DM3 is set to for example $V_{TP}/4$, that is, set to ¼ of the maximum level.

When the level of the output signal of the delay element is larger than the reference voltage $V_{ref2}$, a signal of a high level is output by the comparison circuit, while conversely when the level of the output signal of the delay element is smaller than the reference voltage $V_{ref2}$, a signal of a low level is output by the comparison circuit. The output signal of the comparison circuit is input to the delay circuit of the next stage, inverted by the inverter and further input to the delay element of the delay circuit of next the stage.

In this way, by changing the level of the reference voltage $V_{ref2}$ in the comparison circuit, the oscillation frequency of the oscillator circuit changes. By setting the reference voltage $V_{ref2}$ smaller than a half of the maximum level as in the present example, the delay time in the delay element is increased, therefore the oscillation cycle of the oscillator circuit is increased in accordance with this, that is, the oscillation frequency becomes small.

Fifth Embodiment

FIGS. 32, 33 and 34A to 34C are circuit diagrams and waveform diagrams of an oscillator circuit according to a fifth embodiment of the present invention. Below, an explanation will be made of the configuration and operation of the oscillator circuit of the present embodiment by referring to these figures.

Figure 32:
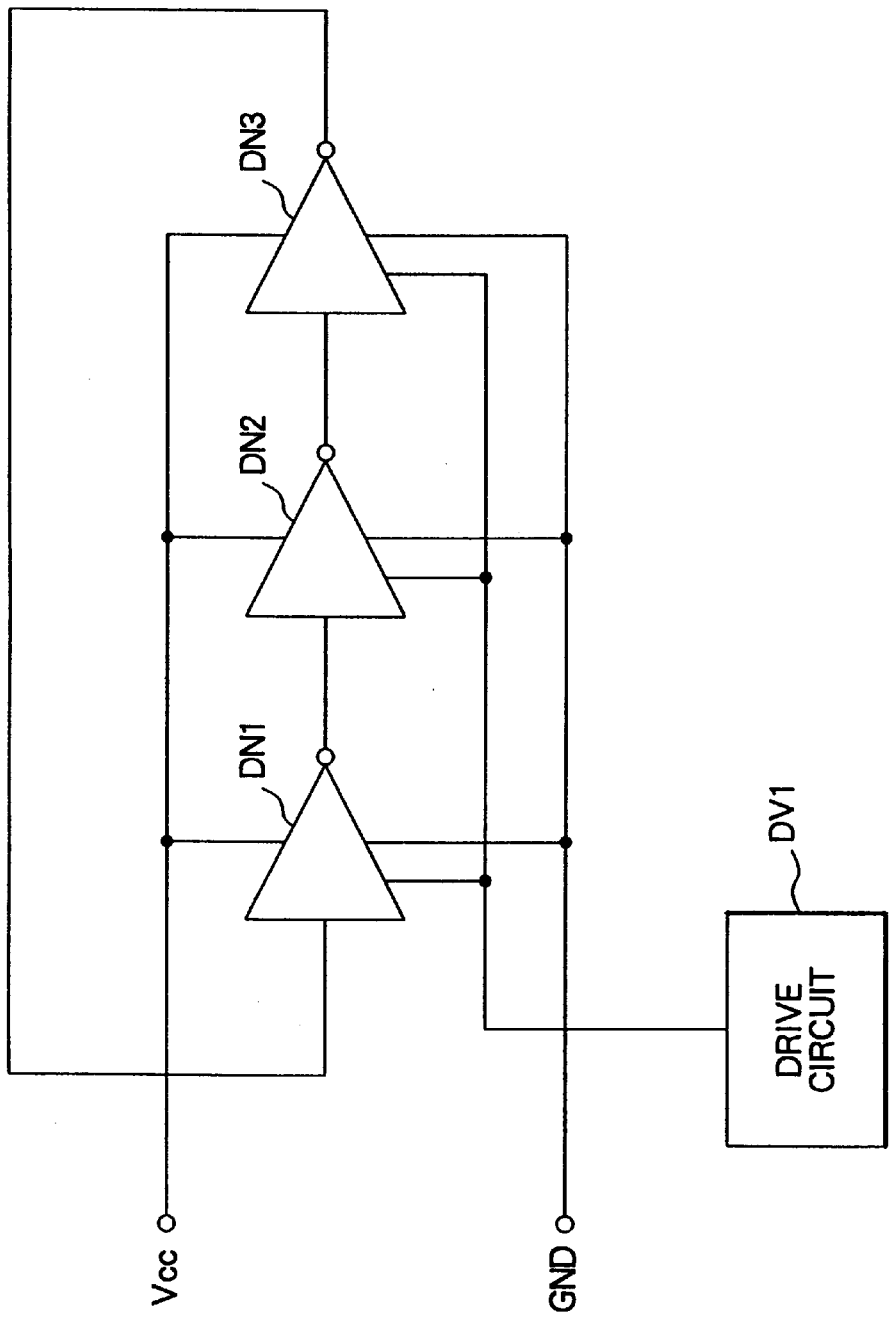
FIG. 32 is a circuit diagram of an oscillator circuit according to a fifth embodiment of the present invention and a circuit diagram of an example of the configuration of an oscillator circuit comprising three stages of inverting delay circuits.

FIG. 32 shows an equivalent circuit of an oscillator circuit comprising three stages of inverting delay circuits.

As illustrated, the oscillator circuit of the present example is constituted by three stages of inverting delay circuits DN1, DN2, and DN3 and a drive circuit DV1 for supplying a drive voltage required for these inverting delay circuits.

The inverting delay circuits DN1, DN2, and DN3 are connected in the form of a ring, the output signal of the inverting delay circuit DN1 is input to the inverting delay circuit DN2, and the output signal of the inverting delay circuit DN2 is input to the inverting delay circuit DN3. Further, the output signal of the inverting delay circuit DN3 is fed back to the input side of the inverting delay circuit DN1.

The inverting delay circuits DN1, DN2, and DN3 operate by using the common power supply voltage $V_{CC}$ as the operation voltage, then these inverting delay circuits utilize the common ground voltage GND.

The drive circuit DV1 supplies required drive voltages to the inverting delay circuits.

Figure 33:
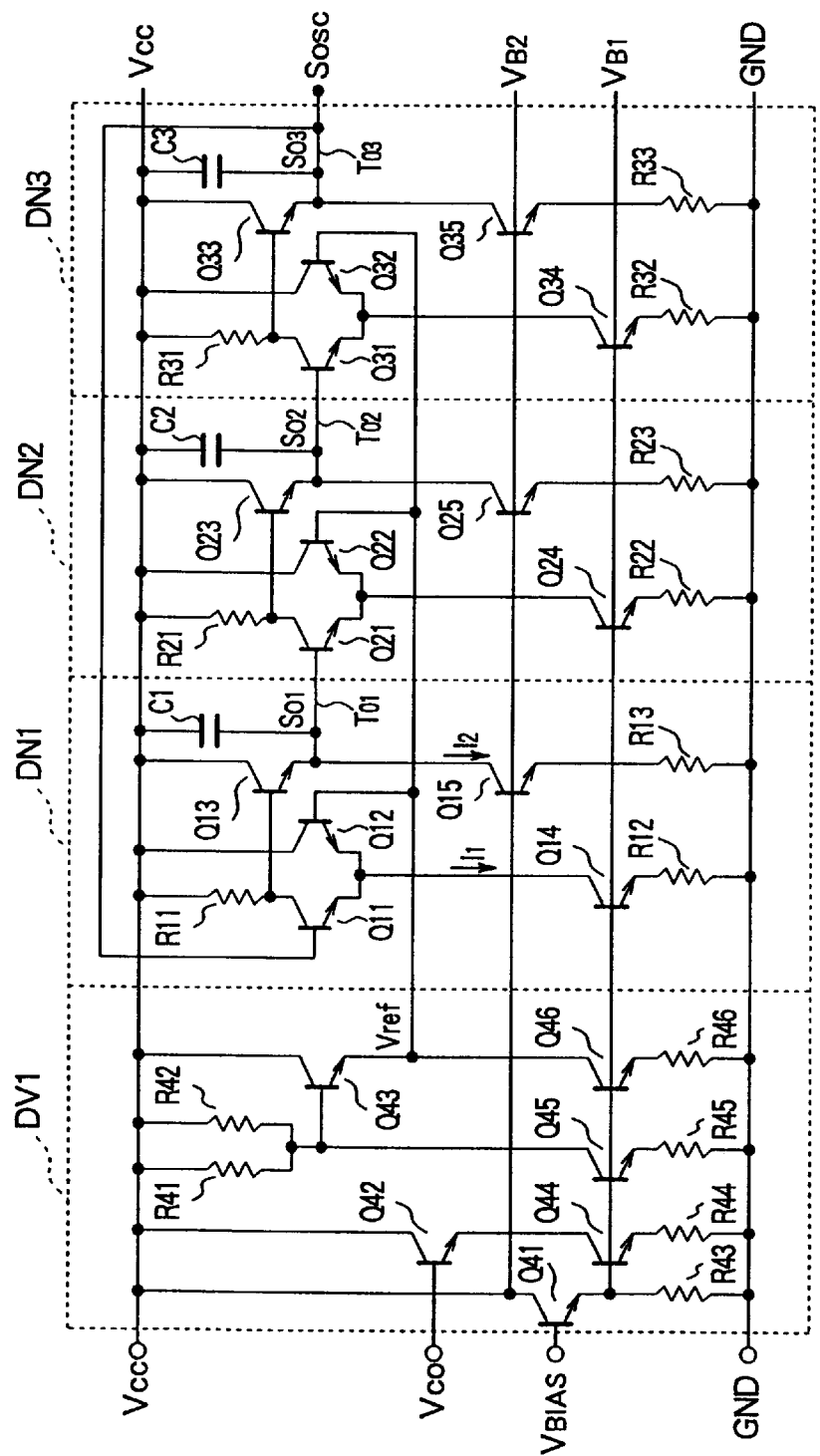
FIG. 33 is a circuit diagram of a concrete example of a configuration of the fifth embodiment.
Figure 34:
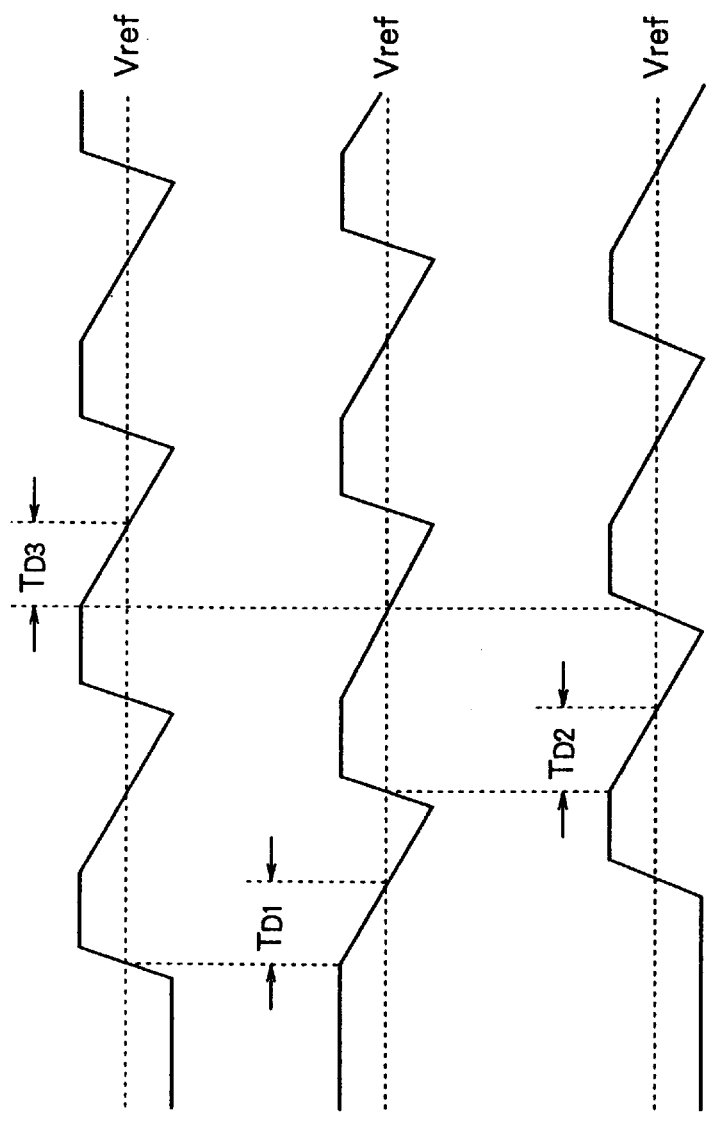
FIGS. 34A to 34C are waveform diagrams of the operation of the oscillator circuit of the fifth embodiment.

FIG. 33 shows a concrete example of the configuration of the oscillator circuit shown in FIG. 32.

As illustrated, the oscillator circuit of the present example is constituted by inverting delay circuits DN1, DN2, and DN3 connected in the form of a ring and the drive circuit DV1 supplying the reference voltage $V_{ref}$ and drive voltages $V_{B1}$ and $V_{B2}$ to these circuits.

Below, an explanation will be made of the configuration of parts of the inverting delay circuits DN1, DN2, and DN3 and drive circuit DV1 by referring to FIG. 33.

The drive circuit DV1 is constituted by resistance elements R41, R42, . . . and R46 and npn transistors Q41, Q42, . . . , and Q46.

The base of the transistor Q41 is connected to the input terminal of a bias voltage $V_{BIAS}$, the collector is connected to the supply line of the power supply voltage $V_{CC}$, and the emitter is grounded via the resistance element R43.

The base of the transistor Q42 is connected to the input terminal of the operation control voltage $V_{CO}$, the collector is connected to the supply line of the power supply voltage $V_{CC}$, and the emitter is connected to the collector of the transistor Q44.

The base of the transistor Q44 is connected to the emitter of the transistor Q41, and the emitter is grounded via the resistance element R44.

The resistance elements R41 and R42 are connected in parallel between the supply line of the power supply voltage $V_{CC}$ and the collector of the transistor Q45. The base of the transistor Q45 is connected to the emitter of the transistor Q41, and the emitter is grounded via the resistance element R45.

The base of the transistor Q43 is connected to the collector of the transistor Q45, the collector is connected to the supply line of the power supply voltage $V_{CC}$, and the emitter is connected to the collector of the transistor Q46. Further, the base of the transistor Q46 is connected to the emitter of the transistor Q41, and the emitter is grounded via the resistance element R46.

In the drive circuit DV1 constituted in this way, when the operation control voltage $V_{CO}$ and the bias voltage $V_{BIAS}$ are held at predetermined levels, for example, levels which can turn the transistors Q42 and transistor Q41 on, the emitter voltages of the transistors Q41 and Q42 are set in accordance with the levels of the bias voltage $V_{BIAS}$ and the operation control voltage $V_{CO}$, respectively.

Here, if the base-emitter voltage of the transistors Q41 and Q42 are $V_{BE1}$ and $V_{BE2}$, respectively, when the transistors Q41 and Q42 are in the on state, the emitter voltages $V_{B1}$ and $V_{B2}$ of the transistors Q41 and Q42 are respectively given by following equations:

$$V_{B1}=V_{BIAS}-V_{BE1}$$
$$V_{B2}=V_{CO}-V_{BE2} \tag{3}$$

The voltage $V_{B1}$ is supplied to the base of each transistor as the base bias voltage of the transistors Q44, Q45, and Q46.

Further, the voltages $V_{B1}$ and $V_{B2}$ are supplied to the inverting delay circuits as the drive voltages of the inverting delay circuits DN1, DN2, and DN3.

Collector currents of the transistors Q44, Q45, and Q46 are respectively determined in accordance with the values of the base bias voltage $V_{B1}$ and resistance values of the resistance elements R45 and R46. The base voltage of the transistor Q43 is set in accordance with the collector current of the transistor Q45 and the resistance values of the resistance elements R41 and R42. The emitter follower is constituted by the current source comprising the transistor Q43, the transistor Q46, and the resistance element R46, therefore the emitter voltage thereof is determined in accordance with the base voltage of the transistor Q43. The emitter voltage of the transistor Q43 is supplied to the inverting delay circuits DN1, DN2, and DN3 as the reference voltage $V_{ref}$.

The inverting delay circuits DN1, DN2, and DN3 have the same configurations. Here, the explanation will be primarily made of the configuration and operation of the inverting delay circuit DN1.

The inverting delay circuit DN1 is constituted by resistance elements R11 and R12, capacitor C1, and npn transistors Q11, Q12, Q13, Q14, and Q15.

The differential amplifier circuit is constituted by the transistors Q11 and Q12. The base of the transistor Q11 is connected to the output terminal of the inverting delay circuit DN3, and the collector is connected to the supply line of the power supply voltage $V_{CC}$ via the resistance element R11. The reference voltage $V_{ref}$ generated by the drive circuit DV1 is supplied to the base of the transistor Q12, and the collector thereof is connected to the supply line of the power supply voltage $V_{CC}$.

The base of the transistor Q11 constitutes the input terminal of the inverting delay circuit DN1.

Emitters of the transistors Q11 and Q12 are connected to each other, and the connection point is connected to the collector of the transistor Q14.

The drive voltage $V_{B1}$ generated by the drive circuit DV1 is supplied to the base of the transistor Q14, and the emitter is grounded via the resistance element R12.

The base of the transistor Q13 is connected to the collector of the transistor Q12, and the collector is connected to the supply line of the power supply voltage $V_{CC}$. The emitter of the transistor Q13 and the collector of the transistor Q15 are connected, and the output terminal $T_{O1}$ of the inverting delay circuit DN1 is constituted by the connection point thereof.

The drive voltage $V_{B2}$ generated by the drive circuit DV1 is supplied to the base of the transistor Q15, and the emitter is grounded via the resistance element R13.

One electrode of the capacitor C1 is connected to the supply line of the power supply voltage $V_{CC}$, and the other electrode is connected to the output terminal $T_{O1}$ of the inverting delay circuit DN1.

In this way, by the transistor Q14 and the resistance element R12, the current source supplying the drive current to the differential amplifier circuit comprising the transistors Q11 and Q12 is constituted. Similarly, the current source supplying the drive current to the emitter of the transistor Q13 is constituted by the transistor Q15 and the resistance element R13.

Further, the transistor Q13 and the current source supplying the drive current to this constitute the emitter follower together.

The capacitor C1 repeats charging and discharging operation in accordance with the on/off state of the transistor Q13 forming the emitter follower. The voltage of the output terminal $T_{O1}$ of the inverting delay circuit DN1 changes along with this.

Below, an explanation will be made of the operation of the inverting delay circuit DN1 having the above configuration by referring to FIG. 33.

The output signal $S_{O3}$ of the inverting delay circuit DN3 is input to the input terminal of the inverting delay circuit DN1, that is, the base of the transistor Q11, and the levels of the input signal $S_{O3}$ and the reference voltage $V_{ref}$ are compared by the differential amplifier circuit constituted by the transistors Q11 and Q12.

Where the level of the input signal $S_{O3}$ is higher than the reference voltage $V_{ref}$, the drive current $I_1$ generated by the current source comprising the transistor Q14 and the resistance element R12 flow to the transistor Q11 side of the differential amplifier circuit. In accordance with this, the collector voltage of the transistor Q11 is held at a low level, and the transistor Q13 constituting the emitter follower is held in an off state.

For this reason, the capacitor C1 is charged by the drive current $I_2$ generated by the current source comprising the transistor Q15 and the resistance element R13. Along with this, the voltage of the output terminal $T_{O1}$ of the inverting delay circuit DN1 is gradually lowered.

When the level of one input signal $S_{O3}$ is lowered and becomes for example reference voltage $V_{ref}$ or less, the transistor Q11 switches to the off state, and the transistor Q12 enters the on state. For this reason, the drive current $I_1$ flows to the transistor Q12 side. In accordance with this, the collector voltage of the transistor Q11 is held at a high level, for example, the power supply voltage $V_{CC}$ or a level near this.

At this time, the transistor Q13 constituting the emitter follower enters the on state, the charged capacitor C1 discharges via the transistor Q13 in accordance with this, and the voltage of the output terminal $T_{O1}$ of the inverting delay circuit DN1 abruptly rises and reaches $V_{CC}-V_f$.

The inverting delay circuits DN2 and DN3 have the same configuration as that of the inverting delay circuit DN1, therefore the operation of each is similar to that of the inverting delay circuit DN1. The output signal $S_{O1}$ of the inverting delay circuit DN1 is input to the inverting delay circuit DN2, and the output signal $S_{O2}$ of the inverting delay circuit DN2 is input to the inverting delay circuit DN3. Further, the output signal $S_{O3}$ of the inverting delay circuit DN3 is fed back to the input terminal of the inverting delay circuit DN1, therefore the ring oscillator circuit is constituted.

FIGS. 34A to 34C are waveform diagrams of waveforms of the input signal of the inverting delay circuit DN1, that is, the output signal $S_{O3}$ of the inverting delay circuit DN3, the output signal $S_{O1}$ of the inverting delay circuit DN1, and the output signal $S_{O2}$ of the inverting delay circuit DN2. Below, an explanation will be made of the operation of the oscillator circuit of the present embodiment by referring to FIGS. 34A to 34C.

As illustrated, in the inverting delay circuit DN1, when the input signal $S_{O3}$ is held at a low level, the output signal $S_{O1}$ of the inverting delay circuit DN1 is held at a high level. When the level of the input signal $S_{O3}$ rises and reaches the reference voltage $V_{ref}$, the capacitor C1 starts to be charged. The output signal $S_{O1}$ gradually falls along with the charging of the capacitor C1.

When the level of the output signal $S_{O1}$ of the inverting delay circuit DN1 becomes the reference voltage $V_{ref}$ or less, in the inverting delay circuit DN2, the capacitor C2 discharges, therefore the output signal $S_{O2}$ abruptly rises.

As shown in FIGS. 34A to 34C, here, a time TD1 from when the level of the output signal $S_{O1}$ of the inverting delay circuit DN1 starts to fall until it reaches the reference voltage $V_{ref}$ is defined as the delay time of the inverting delay circuit DN1.

In the inverting delay circuit DN3, when the level of the input signal $S_{O2}$ exceeds the reference voltage $V_{ref}$, the capacitor C3 is charged. Along with this, the level of the output signal $S_{O3}$ gradually falls. Then, when the level of the signal $S_{O3}$ becomes lower than the reference voltage $V_{ref}$, in the inverting delay circuit DN1, the capacitor C1 starts charging, therefore the output signal $S_{O1}$ abruptly rises.

Here, the time $T_{D3}$ from when the output signal $S_{O3}$ of the inverting delay circuit DN3 starts to fall to when it reaches the reference voltage $V_{ref}$ is defined as the delay time of the inverting delay circuit DN3.

Further, along with the rise of the output signal $S_{O1}$ of the inverting delay circuit DN1, the capacitor C2 of the inverting delay circuit DN2 is charged, and the output signal $S_{O2}$ is gradually lowered.

When the output signal $S_{O2}$ of the inverting delay circuit DN2 becomes the reference voltage $V_{ref}$ or less, in the inverting delay circuit DN3, the capacitor C1 discharges, and the output signal $S_{O3}$ abruptly rises along with this.

The time $T_{D2}$ from when the output signal $S_{O2}$ of the inverting delay circuit DN2 starts to fall to when it reaches the reference voltage $V_{ref}$ is defined as the delay time of the inverting delay circuit DN2.

The above operation is repeatedly carried out in the inverting delay circuits DN1, DN2, and DN3, therefore for example the oscillation signal $S_{OSC}$ is obtained from the output terminal $T_{O3}$ of the inverting delay circuit DN3.

When the same constituent parts of the inverting delay circuits DN1, DN2, and DN3 are constituted by circuit elements having the same performances, where the capacitors C1, C2, and C3 located in the inverting delay circuits use capacitors having the same capacitance value and similarly dimensions of other resistance elements and transistors are set the same, the delay times $T_{D1}$, $T_{D2}$, and $T_{D3}$ of the inverting delay circuits DN1, DN2, and DN3 become almost the same. If delay times of these inverting delay circuits are all $T_D$, the frequency $f_{OSC}$ of the oscillation signal $S_{OSC}$ generated by the oscillator circuit is given by the following equation:

$$f_{OSC}=1/(6 \cdot T_D) \qquad (4)$$

As explained above, according to the present embodiment, the oscillator circuit is constituted by connecting inverting delay circuits DN1, DN2, and DN3 in the form of a ring, drive use voltages $V_{B1}$ and $V_{B2}$ are supplied to the inverting delay circuits by the drive circuit DV1, each inverting delay circuit inverts the input signal in accordance with this and further delays the predetermined delay time $T_D$ with respect to the rising edge thereof and inputs this to the inverting delay circuit of the next stage, therefore a ring oscillator circuit can be constituted, and an oscillation signal having predetermined frequency can be obtained.

Note that in the above explanation, an oscillator circuit constituted by connecting three stages of inverting delay circuits in the form of a ring was used as an example, but the present invention is not limited to this. Needless to way the oscillator circuit can be constituted by the same principle by connecting inverting delay circuits of an odd number of stages of more than this in the form of a ring.

Sixth Embodiment

FIGS. 35 to 38 are circuit diagrams and waveform diagrams showing an oscillator circuit according to a sixth embodiment of the present invention. Below, an explanation will be made of the configuration and operation of the present embodiment by referring to these figures.

Figure 35:
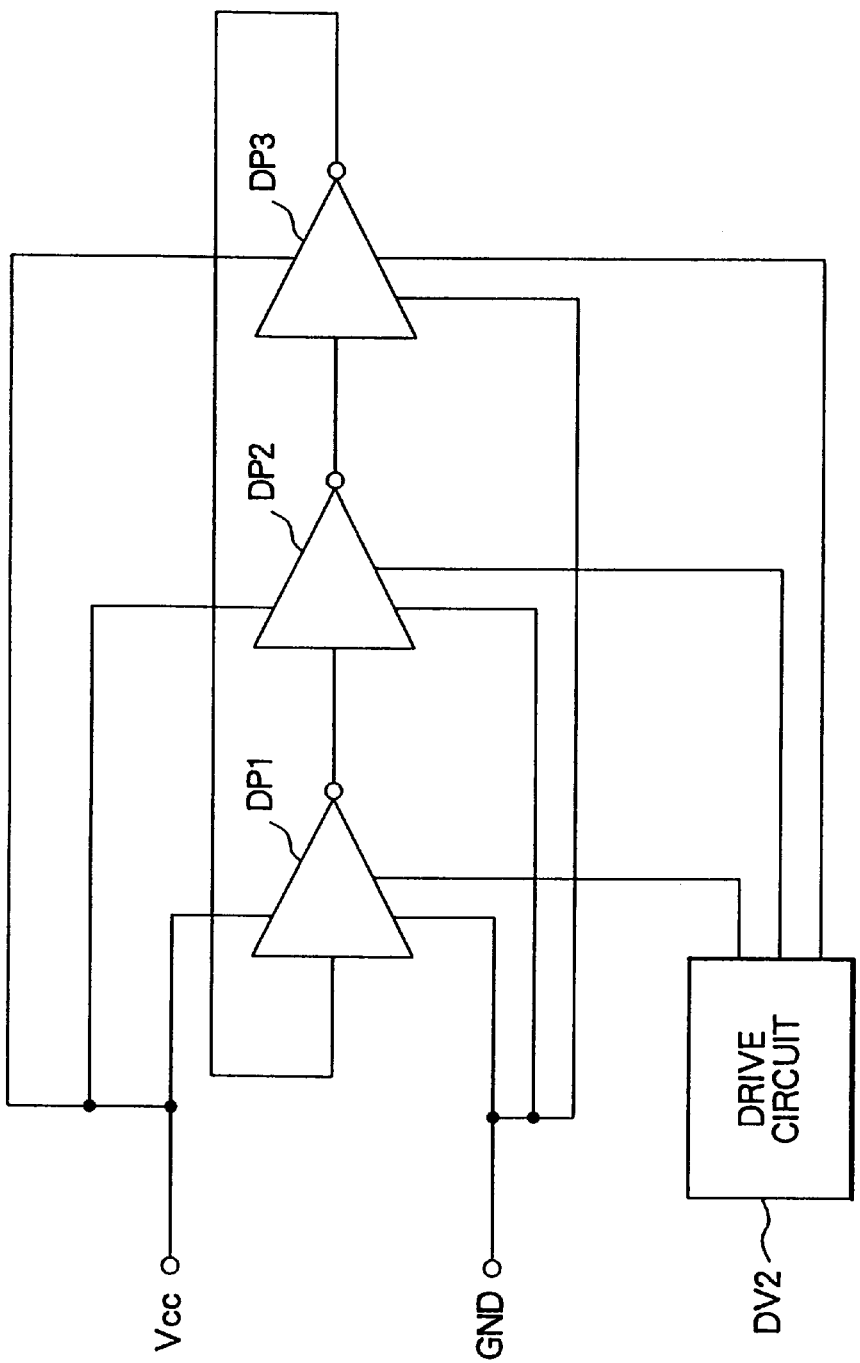
FIG. 35 is a circuit diagram of an oscillator circuit according to a sixth embodiment of the present invention and a circuit diagram showing an example of the configuration of an oscillator circuit comprising three stages of inverting delay circuits.

FIG. 35 shows an equivalent circuit of an oscillator circuit comprising three stages of inverting delay circuits.

As illustrated, the oscillator circuit of the present example is constituted by three stages of inverting delay circuits DP1, DP2, and DP3 and a drive circuit DV2 supplying the drive voltage required for these inverting delay circuits.

The inverting delay circuits DP1, DP2, and DP3 are connected in the form of a ring, the output signal of the inverting delay circuit DP1 is input to the inverting delay circuit DP2, and the output signal of the inverting delay circuit DP2 is input to the inverting delay circuit DP3. Further, the output signal of the inverting delay circuit DP3 is fed back to the input side of the inverting delay circuit DP1.

In the oscillator circuit of the present embodiment, compared with the fifth embodiment shown in FIG. 32, the inverting delay circuits DP1, DP2, and DP3 connected in the form of a ring respectively independently receive the supply of the power supply voltage $V_{CC}$ and common voltage, for example, the ground voltage GND, and further each inverting delay circuit receives the drive use voltage from the drive circuit DV2. By this, the generation of noise due to mutual interference among the inverting delay circuits can be suppressed, jitter produced due to this can be suppressed, and an oscillator circuit with little jitter can be constituted.

Figure 36:
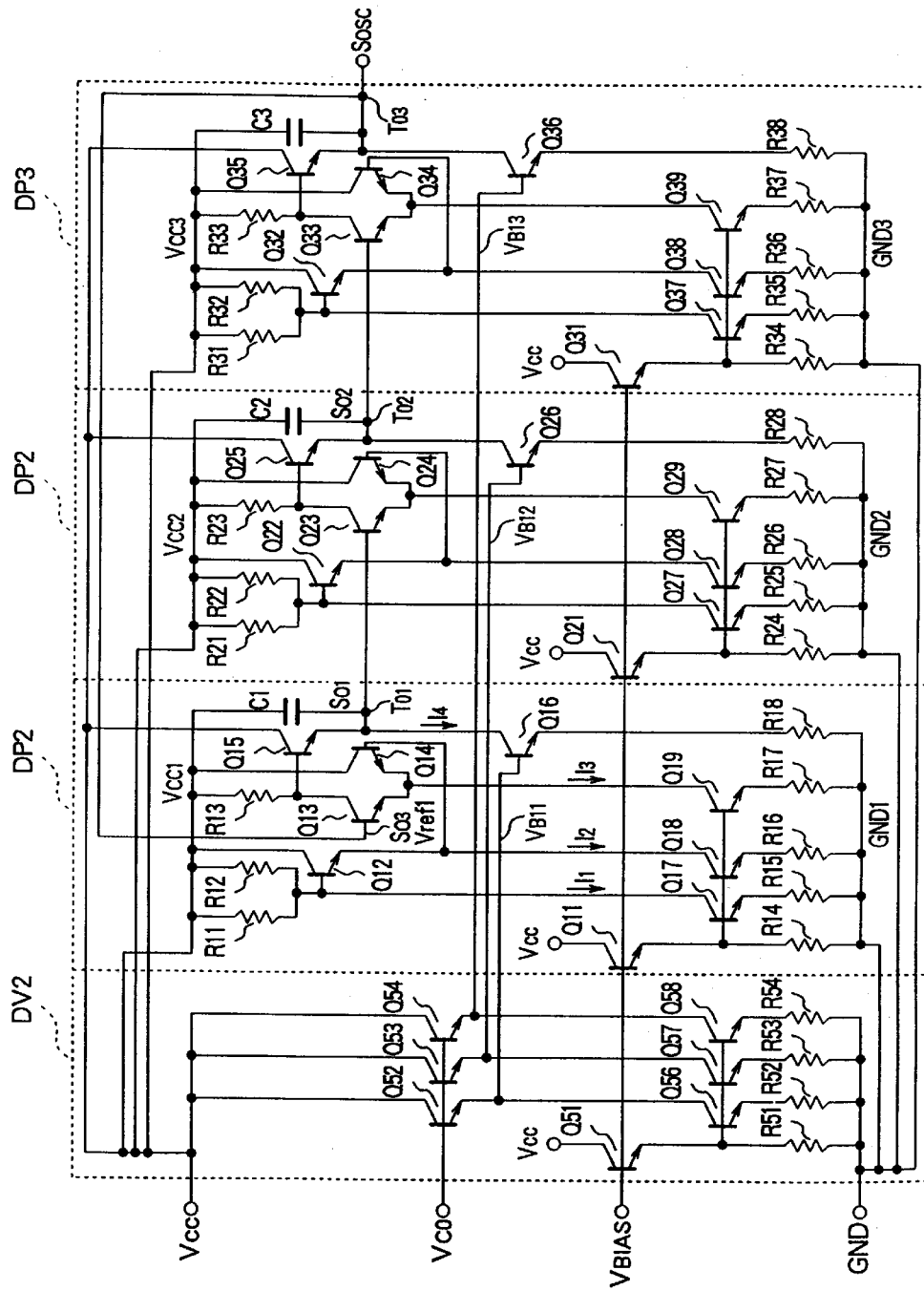
FIG. 36 is a circuit diagram of a concrete example of the configuration of the fifth embodiment.

FIG. 36 is a circuit diagram of a concrete example of the configuration of the oscillator circuit shown in FIG. 35.

As illustrated, in the oscillator circuit of the present example, three stages of inverting delay circuits DP1, DP2, and DP are connected in the form of a ring, and the power supply voltage supply lines and ground lines of the inverting delay circuits are respectively independently provided. Further, drive voltages are respectively independently supplied to the inverting delay circuits by the drive circuit DV2.

First, an explanation will be made of the configuration and operation of the drive circuit DV2.

As illustrated, the drive circuit DV2 is constituted by npn transistors Q51, Q52, . . . , and Q58 and resistance elements R51, R52, R53, and R54.

The collector of the transistor Q51 is connected to the supply line of the power supply voltage $V_{CC}$, the base is connected to the input terminal of the bias voltage $V_{BIAS}$, and the emitter is grounded via the resistance element R51.

Bases of the transistors Q56, Q57, and Q58 are commonly connected to the emitter of the transistor Q51, and emitters are grounded via the resistance elements R52, R53, and R54, respectively.

Collectors of the transistors Q52, Q53, and Q54 are commonly connected to the supply line of the power supply voltage $V_{CC}$, bases are connected to the input terminal of the operation control voltage $V_{CO}$ of the oscillator circuit, and emitters are connected to the collectors of the transistors Q56, Q57, and Q58, respectively. Drive voltages $V_{B11}$, $V_{B12}$, and $V_{B13}$ of inverting delay circuits are generated from the emitters of the transistors Q52, Q53, and Q54 and input to the inverting delay circuits DP1, DP2, and DP3, respectively.

In the drive circuit DV2 constituted as mentioned above, when the operation control voltage $V_{CO}$ and the bias voltage $V_{BIAS}$ are held at predetermined levels, for example, levels capable of making the transistors Q52, Q53, and Q54 and the transistor Q51 conductive, the emitter voltages of the transistors Q51, Q52, Q53, and Q54 are set in accordance with the levels of the bias voltage $V_{BIAS}$ and the operation control voltage $V_{CO}$.

The bases of the transistors Q56, Q57 and Q58 are biased by the emitter voltage of the transistor Q51, and the predetermined collector current flows through collectors of these transistors. The collector currents of these transistors are input to the emitters of the transistors Q52, Q53, and Q54 as the drive currents of the transistors Q52, Q53, and Q54.

The inverting delay circuits DP1, DP2, and DP3 have substantially the same configuration. Below, an explanation will be made of the configuration and operation thereof by taking as an example the inverting delay circuit DP1.

As illustrated, the inverting delay circuit DP1 is constituted by transistors Q11, Q12, . . . , and Q19 and resistance elements R11, R12, . . . , and R18. Further, the inverting delay circuit DP1 is provided with a power supply voltage supply line $V_{CC1}$ and ground line GND1 independently from the other inverting delay circuits DP2 and DP3 and drive circuit DV2.

The collector of the transistor Q11 is connected to the supply line of the power supply voltage $V_{CC}$, the base is connected to the input terminal of the bias voltage $V_{BIAS}$, and the emitter is connected to the ground line GND1 via the resistance element R14.

Bases of the transistors Q17, Q18, and Q19 are commonly connected to the emitter of the transistor Q11, and the emitters are connected to the ground line GND1 via the resistance elements R15, R16, and R17, respectively.

By this, the emitter voltage of the transistor Q11 is set in accordance with the bias voltage $V_{BIAS}$ supplied from an external portion, and further the collector currents of the transistors Q17, Q18, and Q19 are set in accordance with the emitter of the transistor Q11.

Here, the collector currents of the transistors Q17, Q18, and Q19 are defined as $I_1$, $I_2$, and $I_3$, respectively.

The resistance elements R11 and R12 are connected in parallel between the supply line $V_{CC1}$ of the power supply voltage and the collector of the transistor Q17, and the connection point thereof is connected to the base of the transistor Q12. The collector of the transistor Q12 is connected to the supply line $V_{CC1}$ of the power supply voltage, and the emitter is connected to the collector of the transistor Q18. Further, the emitter of the transistor Q12 is connected to the base of the transistor Q14.

The transistors Q13 and Q14 constitute a differential amplifier circuit, the collector of the transistor Q13 is connected to the supply line $V_{CC1}$ of the power supply voltage via the resistance element R13, and the base is connected to the output terminal of the inverting delay circuit DP3 and receives as its input the output signal $S_{O3}$ of the inverting delay circuit DP3. Emitters of the transistors Q13 and Q14 are connected to each other, and the connection point thereof is connected to the collector of the transistor Q19.

The base of the transistor Q15 is connected to the collector of the transistor Q13, and the collector is connected to the supply line of the power supply voltage $V_{CC}$. The emitter of the transistor Q15 is connected to the collector of the transistor Q16, and the connection point thereof forms the output terminal $T_{O1}$ of the inverting delay circuit DP1. One electrode of the capacitor C1 is connected to the output terminal $T_{O1}$, and the other electrode is connected to the supply line $V_{CC1}$ of the power supply voltage.

The drive voltage $V_{B11}$ generated by the drive circuit is supplied to the base of the transistor Q16, and the emitter is connected to the ground line GND1 via the resistance element R18.

In the inverting delay circuit DP1 mentioned above, the current $I_1$ is supplied to the base of the transistor Q12 while defining a voltage drop produced in the resistance elements R11 and R12 connected in parallel as the base bias voltage of the transistor Q12. The transistor Q12 and the current source supplying the current $I_2$ constitute an emitter follower, and the reference voltage $V_{ref1}$ is output from the emitter of the transistor Q12 and input to the base of the transistor Q14.

The current $I_3$ is supplied as the drive current to the differential amplifier circuit constituted by the transistors Q13 and Q14. Here, the levels of the signal $S_{O3}$ supplied to the base of the transistor Q13 and the reference voltage $V_{ref1}$ supplied to the base of the transistor Q14 are compared, and where the level of the signal $S_{O3}$ is higher than the reference voltage $V_{ref1}$, the collector voltage of the transistor Q13 is held at a low level and the transistor Q15 is held in the off state, therefore the capacitor C1 is charged by the current $I_4$, and the voltage of the output terminal $T_{O1}$ of the inverting delay circuit DP1 gradually falls.

On the other hand, where the level of the signal $S_{O3}$ is lower than the reference voltage $V_{ref1}$, the collector voltage of the transistor Q13 is held at a high level, and the transistor Q15 is held in the on state. The charged capacitor C1 discharges in accordance with this, and the voltage of the output terminal $T_{O1}$ of the inverting delay circuit DP1 rises and reaches $V_{CC} - V_f$.

In this way, the inverted signal of the input signal $S_{O3}$ is output by the inverting delay circuit DP1. Further, a signal with a predetermined delay time from the rising edge of the input signal $S_{O3}$ is output.

As shown in FIG. 36, the inverting delay circuits DP2 and DP3 have substantially the same configurations as that of the inverting delay circuit DP1, inverted signals of the input signal are output by these inverting delay circuits DP1, DP2, and DP3, and further the rising edge of the input signal is delayed and output. As a result, the oscillator circuit is constituted by three stages of inverting delay circuits connected in the form of a ring, and for example, as shown in FIG. 36, the output signal of the inverting delay circuit DP3 is supplied to the outside as the oscillation signal $S_{OSC}$.

In the present embodiment, the inverting delay circuits DP1, DP2, and DP3 and the drive circuit DV2 for supplying the drive use voltage to these inverting delay circuits are supplied with the power supply voltage $V_{CC}$ or ground voltage GND by respectively independently wiring, therefore the mutual interference of constituent parts of each is reduced, and the generation of jitter in the oscillation signal is suppressed.

Figure 37:
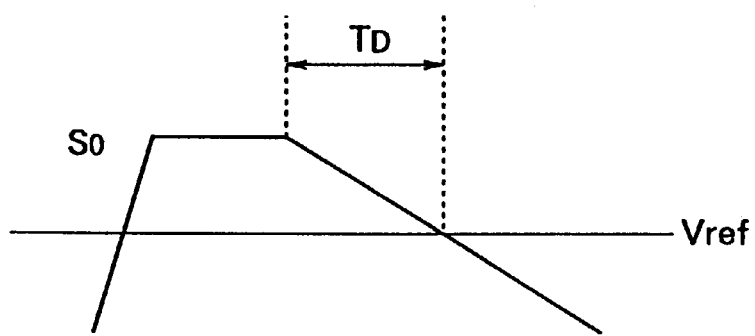
FIG. 37 is a waveform diagram of an ideal case without noise.
Figure 38:
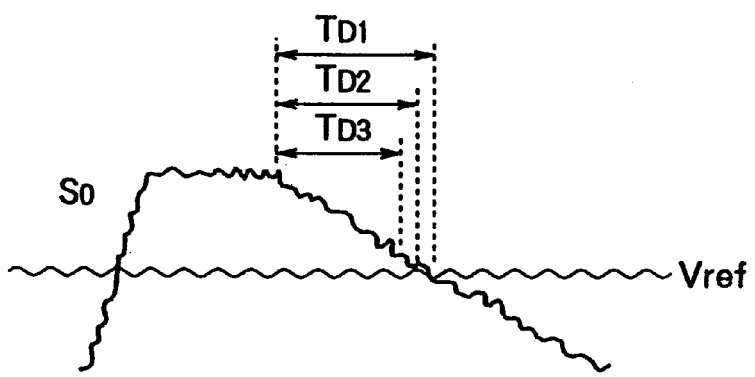
FIG. 38 is a waveform diagram of the waveform when noise exists and a waveform diagram of the occurrence of jitter by this.

FIG. 37 and FIG. 38 show waveforms of for example one part of the output signal $S_O$ of any of the inverting delay circuits DP1, DP2, and DP3. As shown in FIG. 37, when there is no noise, a delay time $T_D$ is produced by the comparison between the output signal $S_O$ and the reference voltage $V_{ref}$. However, as shown in FIG. 38, when noise is mixed in the output signal $S_O$ or the reference voltage $V_{ref}$, the delay time produced in the inverting delay circuit can become any of $T_{D1}$, $T_{D2}$, and $T_{D3}$, therefore the delay time becomes unstable due to the existence of jitter. Further, as a result, the frequency of the oscillation signal generated by the oscillator circuit becomes unstable.

In the present embodiment, as shown in the circuit diagram of FIG. 36, since the power supply voltage $V_{CC}$ and the ground voltage GND are respectively independently supplied to the inverting delay circuits DP1, DP2, and DP3 and the drive use voltage is generated and independently supplied to the inverting delay circuits by the drive circuit DV2, the mutual interference among circuits is reduced, the generation of jitter can be suppressed, and a stable oscillation signal is obtained.

As explained above, according to the present embodiment, the oscillator circuit is constituted by connecting the inverting delay circuits DP1, DP2, and DP3 in the form of a ring, drive use voltages are respectively independently generated and supplied to the inverting delay circuits by the drive circuit DV2, and further the power supply voltage and ground voltage are respectively independently supplied to the inverting delay circuits, therefore the noise produced due to the mutual interference among inverting delay circuits can be reduced, the generation of jitter in the oscillation signal can be suppressed, and a stable oscillation signal can be obtained.

Note that, in the above explanation, the configuration and operation of the oscillator circuit were explained by taking as an example an oscillator circuit constituted by using three stages of inverting delay circuits, but the present invention is not limited to this example of the configuration. Needless to say the oscillator circuit can be constituted by using inverting delay circuits of an odd number of stages of three or more.

As explained above, according to the oscillator circuit of the present invention, the control property of the oscillation frequency is good, and the range of variation of the oscillation frequency can be widely set. Further, a reduction of jitter of the oscillation signal can be realized.

Further, according to the oscillator circuit of the present invention, there is an advantage that the oscillation frequency can be controlled by adjusting the level of the reference voltage.

What is claimed is:

1. An oscillator circuit comprising an odd number of at least three inverting delay circuits, each of the inverting delay circuits comprising an inverting element and a delay element connected to the output side of the inverting element, said inverting delay circuits being connected in the form of a ring, wherein said inverting element comprises a differential amplifier circuit.

2. An oscillator circuit comprising an odd number of at least three inverting delay circuits, each of the inverting delay circuits comprising an inverting element and a delay element connected to the output side of the inverting element, said inverting delay circuits being connected in the form of a ring, wherein said delay element comprises:

a capacitor charging and discharging in accordance with an input signal and a current source for supplying a charging current to said capacitor.

3. An oscillator circuit according to claim 2, further comprising a comparison circuit for comparing the output signal of said delay element and a predetermined reference voltage and outputting a signal of a level in accordance with the result of comparison.

4. An oscillator circuit comprising:

an odd number of inverting delay circuits each comprising an inverting element and a delay element connected to the output side of the inverting element and at least one non-inverting delay circuit comprising a buffer and a delay element connected to the output side of the buffer, said an odd number of inverting delay circuits and at least one non-inverting delay circuit being connected in the form of a ring.

5. An oscillator circuit according to claim 4, wherein said inverting element and said buffer are constituted by differential amplifier circuits.

6. An oscillator circuit according to claim 4, wherein said delay element comprises:

a capacitor charging and discharging in accordance with an input signal and a current source for supplying a charging current to said capacitor.

7. An oscillator circuit according to claim 6, further comprising a comparison circuit for comparing the output signal of said delay element and a predetermined reference voltage and outputting a signal of a level in accordance with the result of comparison.

8. An oscillator circuit according to claim 6, comprising at least three of said inverting delay circuits.

9. An oscillator circuit comprising an odd number of stages of inverting delay circuits connected in the form of a ring, each said inverting delay circuit comprising a comparing means for comparing an input signal and a predetermined reference signal and a capacitance element controlled in charging and discharging state in accordance with the result of comparison of said comparing means.

10. An oscillator circuit according to claim 9, wherein said comparing means comprises a differential amplifier circuit to one input terminal of which said input signal is input and to the other input terminal of which said reference signal is input.

11. An oscillator circuit according to claim 10, further comprising a buffer circuit for outputting a signal in accordance with the output signal of said differential amplifier circuit and thereby controlling the charging and discharging state of said capacitance element.

12. An oscillator circuit according to claim 11, wherein said buffer circuit is formed as an emitter follower.

13. An oscillator circuit according to claim 9, further comprising a reference voltage generation circuit for supplying said reference signal.

14. An oscillator circuit according to claim 9, wherein a power supply line for supplying a power supply voltage and a common voltage line for supplying a common voltage are respectively independently provided in the inverting delay circuit of each stage.

15. An oscillator circuit according to claim 9, wherein a reference voltage generation circuit for generating said reference signal is provided in the inverting delay circuit of each stage.

* * * * *